(12) United States Patent
Yu et al.

(10) Patent No.: US 12,387,809 B2
(45) Date of Patent: Aug. 12, 2025

(54) METHOD FOR OPTIMIZING FLASH MEMORY CHIP AND RELATED APPARATUS

(71) Applicant: HUAWEI TECHNOLOGIES CO., LTD., Guangdong (CN)

(72) Inventors: Jun Yu, Dongguan (CN); Guoyu Wang, Chengdu (CN); You Li, Chengdu (CN); Yongyao Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 167 days.

(21) Appl. No.: 18/455,031

(22) Filed: Aug. 24, 2023

(65) Prior Publication Data

US 2023/0402121 A1 Dec. 14, 2023

Related U.S. Application Data

(63) Continuation of application No. PCT/CN2022/073186, filed on Jan. 21, 2022.

(30) Foreign Application Priority Data

Feb. 26, 2021 (CN) .......................... 202110220794.2

(51) Int. Cl.
*G11C 29/12* (2006.01)
*G11C 29/46* (2006.01)

(52) U.S. Cl.
CPC .... *G11C 29/1201* (2013.01); *G11C 29/12015* (2013.01); *G11C 29/46* (2013.01)

(58) Field of Classification Search
CPC .......... G11C 29/1201; G11C 29/12015; G11C 29/46; G11C 16/26; G11C 16/349;
(Continued)

(56) References Cited

U.S. PATENT DOCUMENTS

2019/0042382 A1* 2/2019 Pappu ..................... G06F 11/26
2019/0042498 A1* 2/2019 Morris ............... G06F 13/1684

FOREIGN PATENT DOCUMENTS

JP 2014517964 A 7/2014
WO 2014068739 A1 5/2014

OTHER PUBLICATIONS

Office Action issued in JP2023-552102, dated Dec. 9, 2024 with English translation, 11 pages.

* cited by examiner

*Primary Examiner* — Mohammed A Bashar

(57) ABSTRACT

Embodiments of the present disclosure provide a method for optimizing a flash memory chip and a related apparatus. The method comprises, after completing write training of a nonvolatile flash interface (NFI) and establishing a data strobe signal (DQS) trigger point that triggers a memory to identify an electrical level state of a write data signal (DQ) corresponding to the DQS trigger point, determining whether a trigger condition for monitoring the NFI is met, wherein the trigger condition is related to working environmental data of the NFI; upon determining that the trigger condition for monitoring the NFI is met, writing test data to the memory and performing a margin test on the NFI to determine whether the NFI passes a margin test; and upon determining that the NFI does not pass the margin test, initiating interface retraining of the NFI. In this way, the NFI bus channels can be optimized without disk disconnection.

21 Claims, 11 Drawing Sheets

(58) Field of Classification Search
CPC ... G11C 29/028; G11C 29/022; G11C 29/023; G11C 29/50012; G06F 3/06; G06F 13/16; G06F 3/061; G06F 3/0629; G06F 3/0679; G06F 13/1678; G06F 13/1689; G06F 2212/1016
See application file for complete search history.

METHOD FOR OPTIMIZING FLASH MEMORY CHIP AND RELATED APPARATUS

CROSS-REFERENCE TO RELATED APPLICATIONS

This application is a continuation of International Application No. PCT/CN2022/073186, filed on Jan. 21, 2022, which claims priority to Chinese Patent Application No. 202110220794.2, filed on Feb. 26, 2021. The disclosures of the aforementioned applications are hereby incorporated by reference in their entireties.

TECHNICAL FIELD

The present disclosure relates to the field of storage technologies, and in particular, to a method for optimizing a flash memory chip and a related apparatus.

BACKGROUND

A flash memory chip with a high read/write (I/O) rate usually brings better user experience to a user. Increasing a bus rate of a nonvolatile flash interface (NFI) is an effective way to improve an I/O rate. However, with increasing of the bus rate of the NFI, an ideal data width decreases accordingly. Consequently, bus link reliability is reduced and a fault such as data loss is caused.

A solution to a single-bit error of a single channel in an NFI bus is to resend data of a channel where a bit error occurs. However, as a quantity of NFI bus channels increases, a probability of single-bit errors increases accordingly. In addition, data resending greatly affects read and write performance of the flash memory chip, and degrades user experience.

SUMMARY

Embodiments of the present disclosure provide a method for optimizing a flash memory chip and a related apparatus, so that some channels in an NFI bus can be optimized without disk disconnection.

According to a first aspect, an embodiment of the present disclosure provides a method for optimizing a flash memory chip. The method includes: suspending N channels in a nonvolatile flash interface NFI bus of the flash memory chip in a service running process of the flash memory chip, where N is an integer greater than or equal to 1 and less than or equal to a total quantity of channels in the NFI bus; determining at least one to-be-optimized channel from the N channels; determining an optimization parameter of each to-be-optimized channel based on training data of each to-be-optimized channel in the at least one to-be-optimized channel; and optimizing each to-be-optimized channel based on the optimization parameter of each to-be-optimized channel.

In the foregoing technical solution, some channels in the NFI bus can be optimized in the normal running process of the flash memory chip. In other words, the other channels can maintain a normal working state. In this way, the NFI bus channel can be optimized without disk disconnection.

With reference to the first aspect, in a possible implementation of the first aspect, the determining at least one to-be-optimized channel from the N channels includes: performing a margin test on an $n^{th}$ channel in the N channels to obtain a margin of the $n^{th}$ channel, where n is an integer from 1 to N (including 1 and N) in sequence; determining whether the margin of the $n^{th}$ channel meets a margin condition, where the margin condition includes at least one of a timing margin condition and a voltage margin condition; and if the margin of the $n^{th}$ channel does not meet the margin condition, determining that the $n^{th}$ channel belongs to the to-be-optimized channel.

In the foregoing technical solution, a channel that needs to be optimized may be determined, to prepare for subsequent optimization.

With reference to the first aspect, in a possible implementation of the first aspect, the optimization parameter includes a read optimization voltage and a write optimization voltage, the training data of each to-be-optimized channel includes K read margins and K write margins of each to-be-optimized channel, and K is a positive integer greater than 1; and the determining an optimization parameter of each to-be-optimized channel based on training data of each to-be-optimized channel in the at least one to-be-optimized channel includes: determining an average value of the K read margins as the read optimization voltage; and determining an average value of the K write margins as the write optimization voltage.

A read reference voltage of a channel may be optimized by using a determined read optimization parameter. Correspondingly, a write reference voltage of the channel may be optimized by using a determined write optimization parameter. By optimizing the read reference voltage and the write reference voltage, a probability of an error in transmission between a flash memory controller and a NAND flash chip can be reduced, and storage performance can be improved.

With reference to the first aspect, in a possible implementation of the first aspect, the K read margins are K read timing margins, the K write margins are K write timing margins, the K read timing margins are in a one-to-one correspondence with K voltage levels, and the K write timing margins are in a one-to-one correspondence with the K voltage levels; the read optimization voltage is determined according to the following formula:

$$Vrx\_best = \frac{V_1 \times T_{rx1} + V_2 \times T_{rx2} + \cdots + V_K \times T_{rxK}}{T_{rx1} + T_{rx2} + \ldots + T_{rxK}}$$

Herein, Vrx_best represents the read optimization voltage, Vk represents a $k^{th}$ voltage level in the K voltage levels, Trx1 represents a $k^{th}$ read timing margin in the K read timing margins, and k=1, . . . K; and the write optimization voltage is determined according to the following formula:

$$Vtx\_best = \frac{V_1 \times T_{tx1} + V_2 \times T_{tx2} + \cdots + V_K \times T_{txK}}{T_{tx1} + T_{tx2} + \ldots + T_{txK}},$$

where Vtx_best represents the write optimization voltage, Vk represents the $k^{th}$ voltage level in the K voltage levels, and Ttx1 represents a $k^{th}$ write timing margin in the K write timing margins.

With reference to the first aspect, in a possible implementation of the first aspect, the K read margins are K read voltage margins, the K write margins are K write voltage margins, the K read voltage margins are in a one-to-one correspondence with K data strobe signal (DQS) delay levels, and the K write voltage margins are in a one-to-one correspondence with the K DQS delay levels; the read optimization voltage is an arithmetic average value of the K read voltage margins; and the write optimization voltage is an arithmetic average value of the K write voltage margins.

With reference to the first aspect, in a possible implementation of the first aspect, the optimization parameter includes a read optimization DQS timing optimization parameter and a write optimization DQS timing optimization parameter, the training data of each to-be-optimized channel includes read direction training data and write direction training data, and the determining an optimization parameter of each to-be-optimized channel based on training data of each to-be-optimized channel in the at least one to-be-optimized channel includes: determining the read optimization DQS timing optimization parameter based on the read direction training data, where the read direction training data includes a left boundary and a right boundary obtained through read direction timing training, the read optimization DQS timing optimization parameter is used to adjust a delay line of a DQS to a first central position, and the first central position is an average value of the left boundary and the right boundary obtained through the read direction timing training; and determining the write optimization DQS timing optimization parameter based on the write direction training data, where the write direction training data includes a left boundary and a right boundary obtained through write direction timing training, the write optimization DQS timing optimization parameter is used to adjust the delay line of the DQS to a second central position, and the second central position is an average value of the left boundary and the right boundary obtained through the write direction timing training.

In the foregoing solution, a timing margin can be optimized by adjusting a position of the delay line of the DQS signal, to enable a timing margin effective width of a signal at a receiving end is maximum, and a setup time margin and a hold time margin are maximum, thereby meeting a specification requirement, and avoiding data loss caused by a bit error during data read/write.

According to a second aspect, an embodiment of the present disclosure provides an electronic device. The electronic device includes units configured to implement any one of the first aspect or the possible implementations of the first aspect.

According to a third aspect, an embodiment of the present disclosure provides a solid-state disk, including an SSD controller. The SSD controller is coupled to a flash memory through a nonvolatile flash interface bus, and the SSD controller is further configured to: be coupled to a memory, and read and execute instructions and/or program code in the memory, to perform any one of the first aspect or the possible implementations of the first aspect.

According to a fourth aspect, an embodiment of the present disclosure provides a chip system. The chip system includes a logic circuit, and the logic circuit is configured to be coupled to an input/output interface, and transmit data through the input/output interface, to perform any one of the first aspect or the possible implementations of the first aspect.

According to a fifth aspect, an embodiment of the present disclosure provides a computer-readable storage medium. The computer-readable storage medium stores program code, and when the computer storage medium runs on a computer, the computer is enabled to perform any one of the first aspect or the possible implementations of the first aspect.

According to a sixth aspect, an embodiment of the present disclosure provides a computer program product. The computer program product includes computer program code, and when the computer program code is run on a computer, the computer is enabled to perform any one of the first aspect or the possible implementations of the first aspect.

DESCRIPTION OF EMBODIMENTS

The following describes technical solutions of the present disclosure with reference to accompanying drawings.

In the present disclosure, "at least one" means one or more, and "a plurality of" means two or more. The term "and/or" describes an association relationship for describing associated objects and represents that any one of three relationships may exist. For example, A and/or B may represent any of the following three cases: Only A exists, both A and B exist, or only B exists. A and B each may be singular or plural. The character "/" generally indicates an "or" relationship between the associated objects. At least one of the following items (pieces) or a similar expression thereof refers to any combination of these items, including any combination of singular items (pieces) or plural items (pieces). For example, at least one of a, b, or c may indicate: a, b, c, a-b, a-c, b-c, or a-b-c, where a, b, and c may be singular or plural.

To help a person skilled in the art better understand the technical solutions in the present disclosure, an application scenario and some related concepts involved in the technical solutions in the present disclosure are first described.

Figure 1:
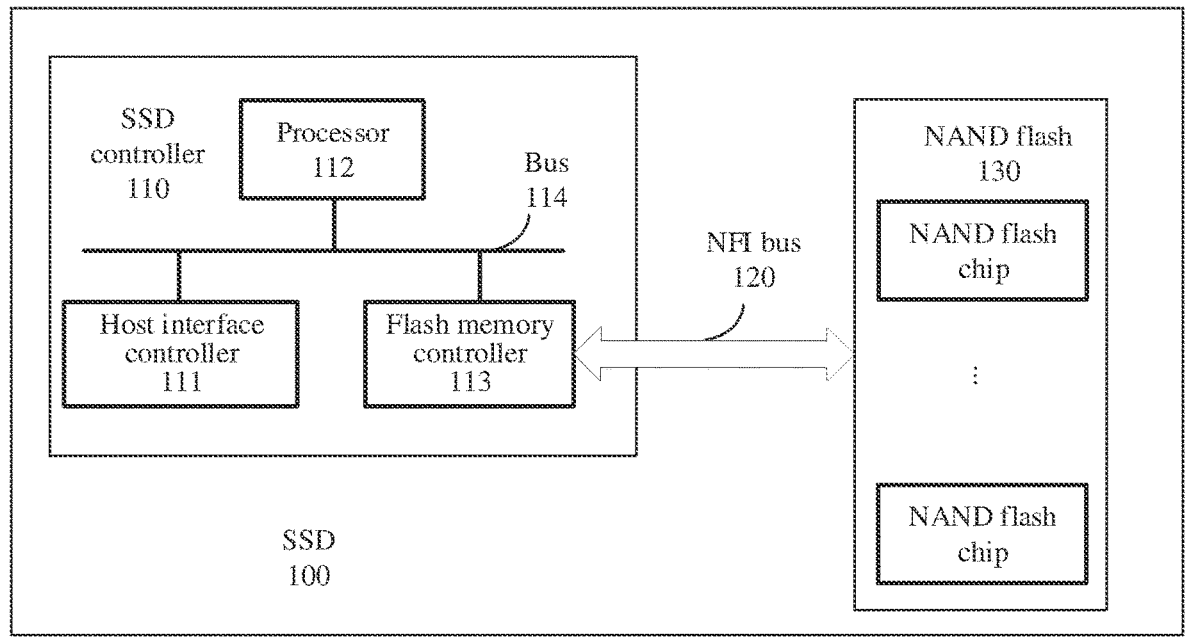
FIG. 1 is a schematic diagram of a possible application scenario according to an embodiment of the present disclosure.

FIG. 1 is a schematic diagram of a possible application scenario according to an embodiment of the present disclosure. As shown in FIG. 1, a solid-state disk (SSD) 100 includes an SSD controller 110 and a NAND flash 130.

The SSD controller 110 includes a host interface controller 111, a processor 112, and a flash memory controller 113.

The host interface controller 111, the processor 112, and the flash memory controller 113 are connected through a bus 114. It may be understood that, in addition to the host interface controller 111, the processor 112, and the flash memory controller 113 shown in FIG. 1, the SSD controller may further include other modules, for example, a cache controller and an error correcting code (ECC) module.

The host interface controller 111 may also be referred to as a front end. The front end is an interface for communication between the host and the SSD. A command and data are transmitted to or out of the SSD through a front end bus. A host may be a computer, a mobile phone, a base station, a trip computer (which may also be referred to as an electronic control unit (ECU)), or the like. A front end interface may be a high-speed serial peripheral component interconnect express (PCIe) interface, a mini serial advanced technology attachment (mSATA) interface, an M.2 (or referred to as a next generation form factor (NGFF)) interface, or another user-defined interface.

The processor 112 may include one or more central processing unit (CPU) cores. The processor 112 is responsible for functions such as calculation and system scheduling. In addition to the CPU core, the processor 112 may further have some peripheral modules, for example, a universal asynchronous receiver/transmitter (UART), a general-purpose input/output (GPIO) module, a temperature sensor, and a timer.

The flash memory controller 113 is responsible for managing writing data to or reading data from the NAND flash 130. The flash memory controller 113 is connected to the NAND flash 130 through the NFI bus 120.

Figure 2:
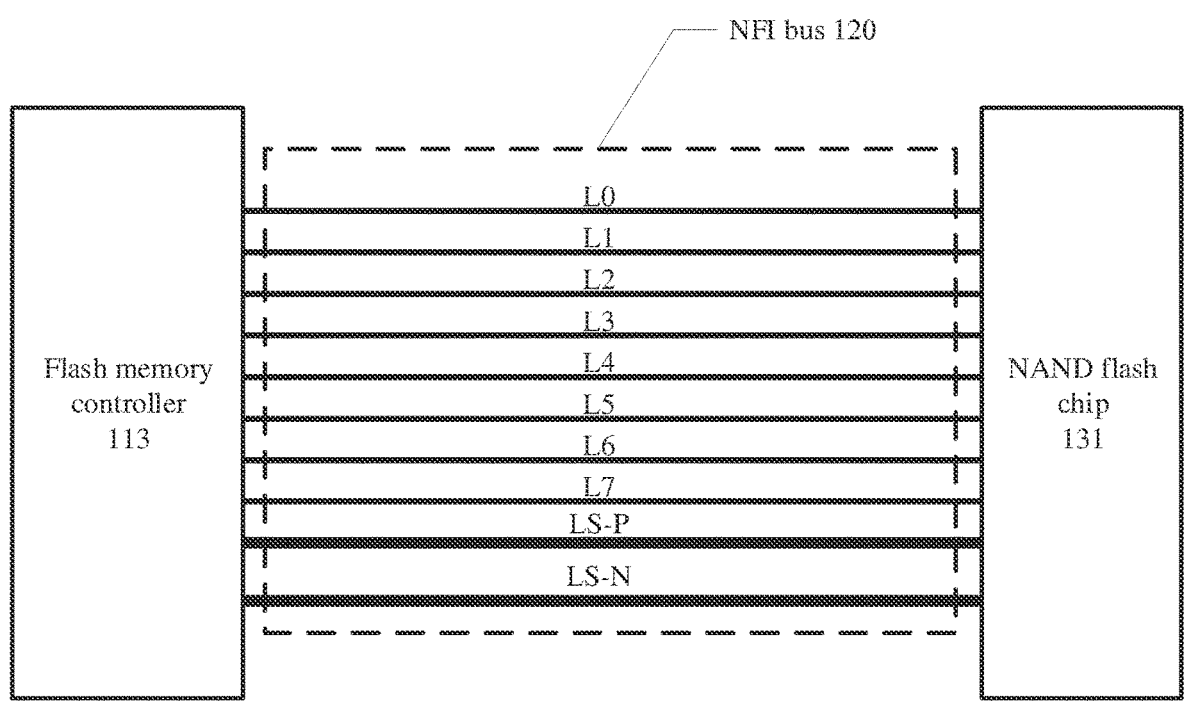
FIG. 2 is a schematic diagram of a flash memory controller and a NAND flash chip.

The following describes the flash memory controller 113 with reference to FIG. 2.

FIG. 2 is a schematic diagram of the flash memory controller and a NAND flash chip. The NAND flash 130 shown in FIG. 1 includes a plurality of NAND flash chips. A NAND flash chip 131 shown in FIG. 2 may be any NAND flash chip of the plurality of NAND flash chips included in the NAND flash 130.

As shown in FIG. 2, the flash memory controller 113 is connected to the NAND flash chip 131 through the NFI bus 120. The NFI bus 120 includes a plurality of data signal lines (for example, data signal lines L0 to L7 in FIG. 2) and a plurality of timing signal lines (for example, timing signal lines LS-P and LS-N in FIG. 1).

The data signal line L0 to the data signal line L7 may transmit eight data signals (DQ) in parallel. For example, the data signal line L0 may transmit a DQ 0, the data signal line L1 may transmit a DQ 1, . . . , and the data signal line L7 may transmit a DQ 7. It should be understood that the DQ is a periodic digital signal, and therefore can carry data. For example, a DQ may transmit 1 bit data in a cycle. In a low electrical level cycle, 1 bit of data "0" may be transmitted, and in a high electrical level cycle, 1 bit of data "1" may be transmitted. The data signal line L0 to the data signal line L7 may transmit the eight DQs in parallel. Therefore, in a cycle, eight bits of data are transmitted in total through the data signal line L0 to the data signal line L7.

It may be understood that, because the DQ is a digital signal, a receiving end of the DQ needs to correctly distinguish a cycle of the DQ through a clock signal that has a same cycle as the DQ, to correctly identify an electrical level state of the DQ, and correctly obtain data carried by the DQ. In view of this, the NFI bus 120 may further include the timing signal line LS-N and the timing signal line LS-P. The timing signal line LS-N and the timing signal line LS-P may transmit a data strobe signal (DQS).

Specifically, the timing signal line LS-N may transmit a DQS-N, and the timing signal line LS-P may transmit a DQS-P. The DQS-N and the DQS-P are phase-inverted signals. For example, the DQS-N and the DQS-P may be shown in FIG. 3. The DQS includes the DQS-N and the DQS-P. The DQS may be used as a clock signal corresponding to the DQ, has a same transmitting end and a same receiving end as the DQ, and may trigger the receiving end of the DQ to identify the electrical level state of the DQ. For ease of description, in this embodiment, the DQS is used to represent the DQS-N and the DQS-P.

It should be noted that bidirectional data transmission between the flash memory controller 113 and the NAND flash chip 131 may be implemented through the NFI bus 120. For example, in a process in which the flash memory controller 113 writes data to the NAND flash chip 131, the flash memory controller 113 may be used as the transmitting end of the DQS and the DQ, and the NAND flash chip 131 may be used as the receiving end of the DQS and the DQ. In a process in which the flash memory controller 113 reads data from the NAND flash chip 131, the NAND flash chip 131 may be used as the transmitting end of the DQS and the DQ, and the flash memory controller 113 may be used as the receiving end of the DQS and the DQ.

For ease of description, in the following embodiments of the present disclosure, a write DQ and a write DQS are respectively used to represent a DQ and a DQS that are sent by the flash memory controller 113 to the NAND flash chip 131 in a process in which the flash memory controller 113 writes data to the NAND flash chip 131; and a read DQ and a read DQS are respectively used to represent a DQ and a DQS that are sent by the NAND flash chip 131 to the flash memory controller 113 in a process in which the flash memory controller 113 reads data from the NAND flash chip 131. The write DQ includes a write DQ 0 to a write DQ 7, and the read DQ includes a read DQ 0 to a read DQ 7.

The following separately describes specific implementations of writing data and reading data.

Scenario 1: The flash memory controller 113 writes data to the NAND flash chip 131.

The processor 112 may invoke the flash memory controller 113 to write data to the NAND flash chip 131. For a specific implementation of invoking the flash memory controller 113 by the processor 112, refer to the conventional technology. This is not limited in this embodiment.

When invoked by the processor 112, the flash memory controller 113 may write data to the NAND flash chip 131. Specifically, the flash memory controller 113 may send the write DQ 0 to the write DQ 7 to the NAND flash chip 131 through the data signal line L0 to the data signal line L7. The write DQ 0 to the write DQ 7 sent by the flash memory controller 113 may carry target write data that needs to be written to the NAND flash chip 131.

In the process in which the flash memory controller 113 writes data to the NAND flash chip 131, the flash memory controller 113 further sends the write DQS to the NAND flash chip 131. The write DQS may trigger the NAND flash chip 131 to identify electrical level states of the write DQ 0 to the write DQ 7. The NAND flash chip 131 may store, based on an identified electrical level state, data carried by the write DQ 0 to the write DQ 7, so that writing data to the NAND flash chip 131 is implemented.

Figure 3:
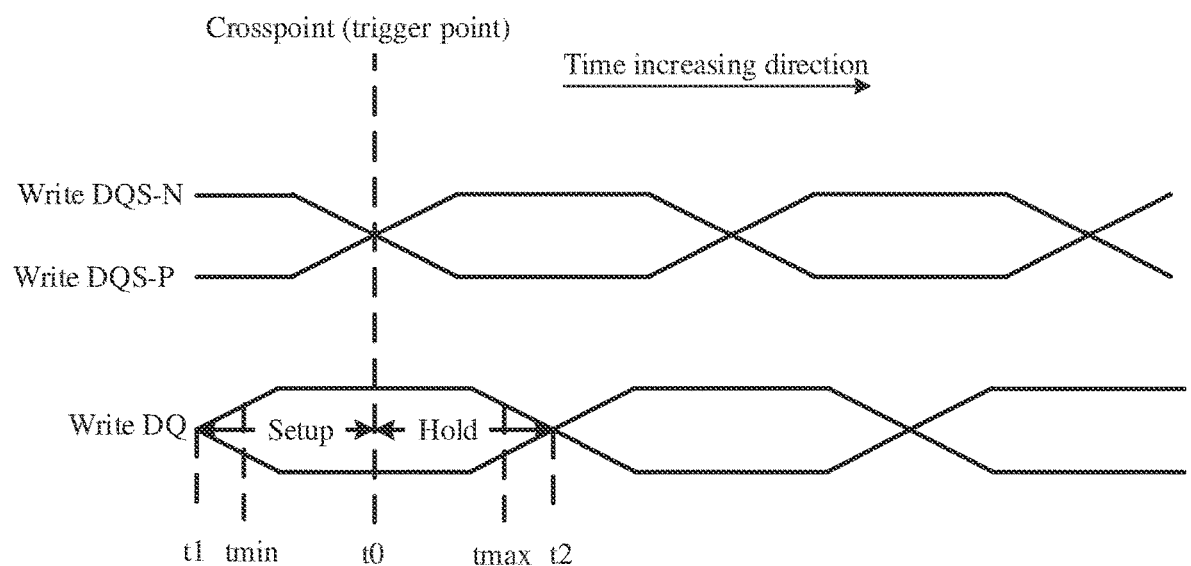
FIG. 3 is a schematic diagram of a DQS-N and a DQS-P.

Generally, in the write DQS sent by the flash memory controller 113 to the NAND flash chip 131, a crosspoint (as shown in FIG. 3) between the write DQS-N and the write DQS-P may be used as a trigger point for triggering the NAND flash chip 131 to identify the electrical level state of the write DQ. That is, when the NAND flash chip 131 determines that the received write DQS is at the crosspoint, the NAND flash chip 131 may identify current electrical level states of the write DQ 0 to the write DQ 7, so that the target write data carried in the write DQ 0 to the write DQ 7 may be written to the NAND flash chip 131.

For example, if the target write data is 11010011, corresponding to a same crosspoint in the write DQS, data carried by the write DQ 0 to the write DQ 7 in this case is: the write DQ 0 may carry "1", the write DQ 1 may carry "1", the write DQ 2 may carry "0", the write DQ 3 may carry "1", the write DQ 4 may carry "0", the write DQ 5 may carry "0", and the write DQ 6 may carry "1", write DQ 7 can carry "1".

When determining that the received write DQS is at the crosspoint, the NAND flash chip 131 may identify the received electrical level states of the write DQ 0 to the write DQ 7. In the foregoing example, the write DQ 0 is a high electrical level (carrying "1"), the write DQ 1 is a high electrical level (carrying "1"), the write DQ 2 is a low electrical level (carrying "0"), the write DQ 3 is a high electrical level (carrying "1"), the write DQ 4 is a low electrical level (carrying "0"), the write DQ 5 is a low electrical level (carrying "0"), the write DQ 6 is a high electrical level (carrying "1"), and the write DQ 7 is a high electrical level (carrying "1"). The NAND flash chip 131 may store the target write data "11010011" based on the identified electrical level states of the write DQ 0 to the write DQ 7.

Scenario 2: The flash memory controller 113 reads data from the NAND flash chip 131.

The processor 112 may invoke the flash memory controller 113 to read data from the NAND flash chip 131. For a specific implementation of invoking the flash memory controller 113 by the processor 112, refer to the conventional technology. This is not limited in this embodiment.

The flash memory controller 113 may be invoked by the processor 112 to indicate the NAND flash chip 131 to send target read data to the flash memory controller 113, so that the flash memory controller 113 reads the target read data in the NAND flash chip 131. For a specific implementation of indicating the NAND flash chip 131 by the flash memory controller 113, refer to the conventional technology. This is not limited in this embodiment.

The NAND flash chip 131 may send the read DQ 0 to the read DQ 7 to the flash memory controller 113 through the data signal line L0 to the data signal line L7. The read DQ 0 to the read DQ 7 may carry the target read data sent to the flash memory controller 113. When the NAND flash chip 131 sends the read DQ 0 to the read DQ 7 to the flash memory controller 113, the NAND flash chip 131 further sends the read DQS to the flash memory controller 113. The flash memory controller 113 may identify electrical level states of the read DQ 0 to the read DQ 7 based on the read DQS, and obtain, based on the identified electrical level states, the target read data carried by the read DQ 0 to the read DQ 7, to read data from the NAND flash chip 131.

Specific implementations of the read DQS and the read DQ 0 to the read DQ 7 are similar to those in the foregoing scenario 1. A difference lies in that, in the read DQS sent by the NAND flash chip 131 to the flash memory controller 113, a middle point between two adjacent crosspoints may be generally used as a trigger point that triggers the flash memory controller 113 to identify the electrical level states of the read DQ 0 to the read DQ 7. In other words, when the NAND flash chip 131 determines that the received read DQS is at the middle point, the flash memory controller 113 may identify current electrical level states of the read DQ 0 to the read DQ 7, to obtain the target read data carried by the read DQ 0 to the read DQ 7.

It can be learned from the foregoing scenario 1 and the foregoing scenario 2 that whether data can be accurately transmitted between the flash memory controller 113 and the NAND flash chip 131 is closely related to whether relative timing positions of the DQS and the DQ that are transmitted in a same direction are aligned. The DQS and the DQ that are transmitted in the same direction may be understood as the read DQS and the read DQ, or may be understood as the write DQS and the write DQ.

The write DQS and the write DQ shown in FIG. 3 are used as an example. The write DQ may be any one of the write DQ 0 to the write DQ 7. A crosspoint of the write DQS is used as a trigger point, and a cycle of the write DQ corresponding to the crosspoint is a write DQ cycle in which a moment at which the crosspoint occurs falls. It can be learned from FIG. 3 that, the trigger point (crosspoint) of the write DQS may divide the cycle of the write DQ corresponding to the trigger point into two parts, where a part before the trigger point is a setup time, and a part after the trigger point is a hold time. It is assumed that a start time point of any write DQ cycle received by the NAND flash chip 131 is t1, an end time point of the write DQ cycle is t2, and between t1 and t2, a time point at which the write DQS received by the NAND flash chip 131 is at the trigger point is t0. In this case, a time period between t1 and t0 may be referred to as the setup time, and a time period between t0 and t2 may be referred to as the hold time.

The sufficiency of the setup time of the write DQ helps improve accuracy of data transmission. Specifically, because the write DQ is a digital signal, the electrical level state of the write DQ is usually variable, that is, the write DQ may be a low electrical level or a high electrical level in any cycle. Between two adjacent cycles, the electrical level state of the write DQ may remain unchanged, or may change from the low electrical level to the high electrical level, or may change from the high electrical level to the low electrical level.

Generally, the high electrical level and the low electrical level are relative to a reference voltage. That is, if an electrical level of the write DQ is lower than the reference voltage, the write DQ is the low electrical level; or if the electrical level of the write DQ is higher than the reference voltage, the write DQ is the high electrical level. When the electrical level state of the write DQ changes, it usually takes a specific delay to complete electrical level state switching. For example, as shown in FIG. 3, the electrical level of the write DQ reaches the reference voltage at tmin and tmax.

An example in which a low electrical level in a previous cycle is switched to a high electrical level in a current cycle is used. If the setup time is insufficient, for example, t0 is between t1 and tmin, an electrical level of the write DQ at t0 may not completely rise to the high electrical level greater than the reference voltage. In this case, the NAND flash chip 131 may mistakenly consider that the write DQ is a low electrical level in the current cycle. That is, the write DQ in the current cycle should be the high electrical level, but is incorrectly identified as a low electrical level because t0 is between t1 and tmin and the electrical level does not completely rise to the high level greater than the reference voltage. As a result, an error occurs in the data written to the NAND flash chip 131. Therefore, to ensure accuracy of data transmission between the flash memory controller 113 and the NAND flash chip 131, it needs to be ensured that the setup time is long enough.

The sufficiency of the hold time of the write DQ also helps improve accuracy of data transmission. Specifically, the NAND flash chip 131 needs a specific delay to identify the electrical level state of the write DQ. For example, the high electrical level in the current cycle is switched to a low electrical level in a next cycle. At t0, the NAND flash chip 131 starts to identify the electrical level state of the write DQ. If the hold time is insufficient, for example, t0 is between tmax and t2, when the NAND flash chip 131 identifies the electrical level state of the write DQ, the electrical level of the write DQ may be lower than the reference voltage (the write DQ is the low electrical level in the next cycle), so that the NAND flash chip 131 incorrectly identifies the electrical level of the current cycle as a low electrical level, and an error occurs in the data written to the NAND flash chip 131. In other words, the electrical level of the write DQ in the current cycle should be a high electrical level, but is mistakenly considered as the low electrical level because t0 is between tmax and t2 and the electrical level is lower than the reference voltage. Therefore, to ensure accuracy of data transmission between the flash memory controller 113 and the NAND flash chip 131, it needs to be ensured that the hold time is long enough.

In conclusion, to improve accuracy of data transmission between the flash memory controller 113 and the NAND flash chip 131, both the hold time and the setup time of the write DQ need to have relatively long duration. When the duration of the hold time or the setup time of the write DQ is insufficient, accuracy of data transmission between the flash memory controller 113 and the NAND flash chip 131 is reduced, and a bit error rate is increased.

Generally, a reference voltage in the flash memory controller 113 is the same as that in the NAND flash chip 131. That is, for the write DQS and the write DQ shown in FIG. 3, a time interval between tmin and t1 may also be referred to as a minimum setup time applicable to the NAND flash chip 131, and a time interval between tmax and t2 may also be referred to as a minimum hold time applicable to the flash memory chip.

In a cycle of the write DQ, a difference between a setup time of the write DQS and the minimum setup time applicable to the NAND flash chip 131 may be referred to as a timing margin of the setup time of the write DQ, and a difference between a hold time of the write DQS and the minimum hold time applicable to the NAND flash chip 131 may be referred to as a timing margin of the hold time of the write DQ. A minimum value of the timing margin of the setup time and the timing margin of the hold time of the write DQ may be understood as a timing margin of the write DQ. For example, in FIG. 3, the timing margin of the write DQ is a minimum value between a difference between t1 and tmin and a difference between tmax and t2.

Generally, a time interval between tmin and tmax is mainly determined by performance of the NAND flash chip 131. In other words, for the flash memory controller 113, a requirement on a setup time and a requirement on a hold time of a chip are determined by performance of the chip, and cannot be adjusted. A timing margin may be adjusted to an optimal value through timing training. Through timing training, the flash memory controller 113 may adjust the time point t0 corresponding to the crosspoint of the write DQS to a middle position between tmin and tmax, that is, the timing margin of the setup time of the write DQ is equal to the timing margin of the hold time. Therefore, the timing margin of the write DQ may be enabled to reach a maximum value, and accuracy of data transmission from the flash memory controller 113 to the NAND flash chip 131 may be optimized from a perspective of a timing margin.

Based on a same reason, in the process in which the flash memory controller 113 reads data from the NAND flash chip 131, a difference between a hold time of the read DQ sent by the NAND flash chip 131 to the flash memory controller 113 and a minimum hold time applicable to the flash memory controller 113 may also be referred to as a timing margin of the hold time of the read DQ. A difference between a setup time of the read DQ and a minimum setup time applicable to the flash memory controller 113 may also be referred to as a timing margin of the setup time of the read DQ. The timing margin of the read DQ may be understood as a minimum value of the timing margin of the hold time and the timing margin of the setup time of the read DQ. When the timing margin of the hold time of the read DQ sent by the NAND flash chip 131 to the flash memory controller 113 is equal to the timing margin of the setup time, the timing margin of the read DQ may be enabled to reach the maximum value. In this case, accuracy of data transmission from the NAND flash chip 131 to the flash memory controller 113 may be optimized from the perspective of the timing margin.

To improve the timing margins of the read DQ and the write DQ, and improve accuracy of data transmission between the flash memory controller 113 and the NAND flash chip 131, the relative timing positions of the DQ and the DQS that are transmitted in the same direction usually need to be aligned. This process is also often referred to as memory training.

In this embodiment, "aligned" may be understood as that in the DQS and the DQ that are transmitted in the same direction, a timing margin of a hold time of the DQ is equal to a timing margin of a setup time, or a timing margin of a hold time of the DQ is not greatly different from a timing margin of a setup time, so that the DQ has a relatively sufficient timing margin of the hold time and a relatively sufficient timing margin of the setup time. The timing margin of the setup time of the DQ is relative to a minimum setup time applicable to the receiving end, and the timing margin of the hold time of the DQ is also relative to a minimum hold time applicable to the receiving end. That is, "aligned" may enable the setup time of the DQ to be not less than the minimum setup time applicable to the receiving end, and enable the hold time of the DQ to be not less than the minimum hold time applicable to the receiving end.

The receiving end may be the NAND flash chip 131, or may be the flash memory controller 113. The minimum setup time and the minimum holding time that are applicable to the receiving end may be obtained based on factors such as a structure and performance of the receiving end. If the setup time of the DQ is less than the minimum setup time applicable to the receiving end, or the hold time of the DQ is less than the minimum hold time applicable to the receiving end, the receiving end cannot correctly identify the data carried by the DQ.

Figure 4:
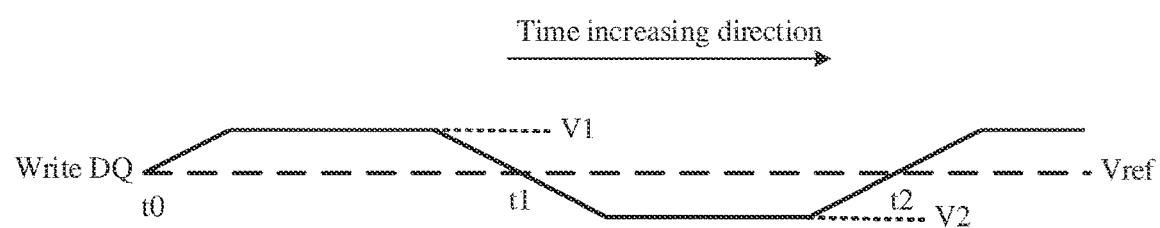
FIG. 4 is a schematic diagram of a write reference voltage.

In addition, the foregoing high electrical level and low electrical level are determined by comparing with the reference voltage. As shown in FIG. 4, starting from t0, a write electrical level is higher than a write reference voltage Vref, and in this case, the NAND flash chip 131 may determine that the write electrical level is a high electrical level, to determine that the written data is 1; starting from t1, the write electrical level is lower than the write reference voltage Vref, and in this case, the NAND flash chip 131 may determine that the write electrical level is a low electrical level, to determine that the written data is 0; and starting from t2, the write electrical level is higher than the write reference voltage Vref, and in this case, the NAND flash chip 131 may determine that the write electrical level is a high electrical level, to determine that the written data is 1.

It is assumed that the write reference voltage Vref is greater than a maximum value of the write electrical level (that is, V1 shown in FIG. 4), and the NAND flash chip 131 considers that the write electrical level is a low electrical level. In this case, the NAND flash chip 131 determines that all written data is 0. Alternatively, it is assumed that the write reference voltage Vref is less than a minimum value of the write electrical level (that is, V2 shown in FIG. 4), and the NAND flash chip 131 considers that the write electrical level is a high electrical level. In this case, the NAND flash chip 131 determines that all written data is 1.

A voltage margin in a write direction is a difference between the reference voltage and the write electrical level. As shown in FIG. 4, a difference between Vref and V2 is the voltage margin in the write direction.

Based on the same reason, in the process in which the flash memory controller 113 reads data from the NAND flash chip 131, a difference between the reference voltage and the read electrical level is a voltage margin in a read direction.

Figure 5:
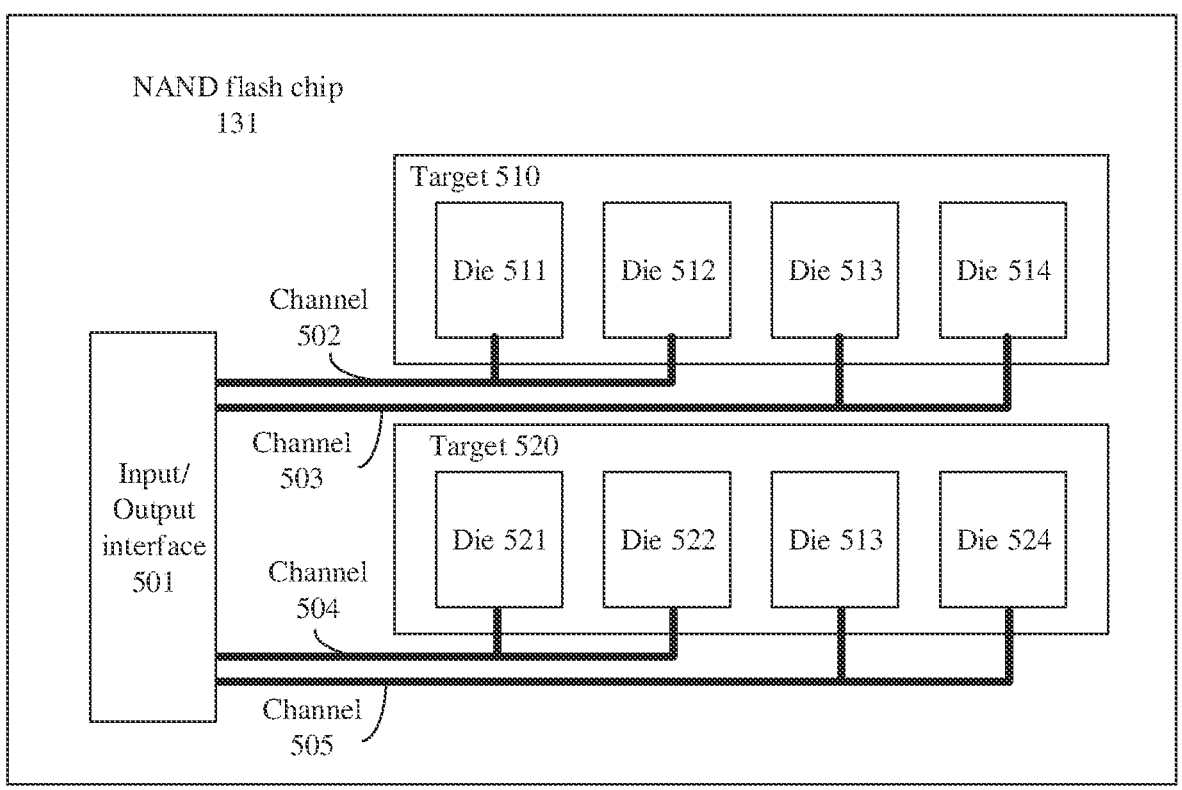
FIG. 5 is a schematic diagram of a NAND flash chip in an electronic device shown in FIG. 1.

FIG. 5 is a schematic diagram of the NAND flash chip in the electronic device shown in FIG. 1.

A flash memory can be classified into a NOR flash and a NAND flash. Compared with the NOR flash, the NANO flash has advantages such as a large capacity, a low price, and a high read/write speed, and therefore is widely applied. Currently, the NAND flash may be applied to a solid-state disk (SSD), a secure digital (SD) card, an add-in card (AID), and the like. The NAND flash may also be used as a storage medium in an electronic device such as a mobile phone or a tablet computer.

A structure of the NAND flash may be divided into a device, a target, a die, a plane, a block, a page, and a cell in descending order.

The NAND flash chip 131 shown in FIG. 5 is a device. The device is a packaged NAND flash cell, and may also be referred to as a package, a flash memory chip, a NAND flash chip, or the like. One storage device (for example, the SSD) may include one or more devices, and one device may include one or more targets. One target may include one or more dies.

For example, the NAND flash chip 131 shown in FIG. 5 includes two targets: a target 510 and a target 520. Each target includes four dies. The target 510 includes a die 511, a die 512, a die 513, and a die 514, and the target 520 includes a die 521, a die 522, a die 523, and a die 524.

The die may also be referred to as a logical unit (LUN). One die may include one or more planes. Each plane may include a large quantity of block pages, each block page includes a large quantity of page pages, and each page includes a large quantity of cells.

A quantity of channels of the flash memory directly reflects a concurrent read/write capability of the solid-state disk. One channel may have one or more dies. Each device supports one or more channels.

For example, the NAND flash chip 131 shown in FIG. 5 further includes an input/output interface 501, a channel 502, a channel 503, a channel 504, and a channel 505. The channel 502 is connected to the die 511 and the die 512, the channel 503 is connected to the die 513 and the die 514, the channel 504 is connected to the die 521 and the die 522, and the channel 505 is connected to the die 523 and the die 524.

The input/output interface 501 of the NAND flash chip 131 may be connected to the flash memory controller through the NFI bus, receive a command from the flash memory controller, and read, based on the received command, data stored in the NAND flash chip 131, write data into the NAND flash chip 131, delete data from the NAND flash chip 131, or the like. For example, if a read command received by the NAND flash chip 131 is to read data stored in the die 511, the data stored in the die 511 may be read through the channel 502, and then the read data is sent to the flash memory controller. For another example, if a write command received by the NAND flash chip 131 is to write data to the die 524, the data may be written to the die 524 through the channel 505.

A data interface of the NAND flash chip is not limited in this embodiment, and may be an SDR, an NV-DDR, an NV-DDR2, or an NV-DDR3.

An ideal data width of the NFI bus refers to a time occupied for single-time data transmission in an ideal transmission environment. The ideal transmission environment means that transmission loss is not considered during data transmission. For example, when a transmission rate of the NFI bus is 400 million times/second (MT/s), a time occupied by each-time data transmission is $(1/400 \times 10^8)$ second, that is, an ideal data width corresponding to each-time data transmission is 2.5 ns.

The ideal data width of the NFI bus is related to performance, a capacity, a rate specification, and the like of a flash memory chip. The transmission rate of the NFI bus is in a reciprocal relationship with the ideal data width of the NFI bus. Therefore, as the transmission rate of the NFI bus increases, the ideal data width of the NFI bus decreases accordingly. For example, if the transmission rate of the NFI bus is 400 MT/s, the ideal data width of the NFI bus is 2.5 ns; if the transmission rate of the NFI bus is 800 MT/s, the ideal data width of the NFI bus is 1.25 ns; if the transmission rate of the NFI bus is 1,200 MT/s, the ideal data width of the NFI bus is 0.83 ns; or if the transmission rate of the NFI bus is 1,600 MT/s, the ideal data width of the NFI bus is ns.

As shown in FIG. 3, a difference between t2 and t1 is an effective width of the data. A smaller ideal data width of the NFI bus indicates a smaller difference between t2 and t1. Correspondingly, the difference between t1 and tmin and the difference between tmax and t2 also decrease accordingly. Consequently, a timing margin becomes smaller. In addition, in an actual data transmission process, after data sent by the transmitting end at the ideal data width is attenuated through a transmission channel, a data width actually obtained by the receiving end is reduced. In this case, the NFI bus is more likely to be affected by external factors such as a temperature and a voltage. As a result, a reliability problem occurs in an NFI bus channel, and a data transmission problem occurs. For example, a bit error occurs during data transmission.

Concepts of an effective width and a margin effective width are described below.

The effective width may be defined as a signal width in which data is actually obtained by the receiving end after the data in the ideal width at the transmitting end arrives at the receiving end after being attenuated when passing through the transmission channel. The margin effective width is a signal width in which preset data is correctly sampled by the receiving end after the preset data is transmitted to the receiving end in the ideal signal width at the transmitting end. Compared with the effective width, the margin effective width removes a time remaining after a data setup time and a data hold time.

For example, if a total of n bits can be transmitted in a DQS cycle, for example, if a transmission rate is 400 Mbps, that is, 4×108 bits are transmitted per second, a time occupied for transmitting each bit is 1 s/(4×108)=2.5 ns, that is, an ideal signal width corresponding to each bit is 2.5 ns. After a signal reaches the receiving end through the transmission channel, the ideal signal width is reduced, and an effective signal width that is actually correctly received by the receiving end is 2 ns.

Herein, bps is a unit of a bit rate, and the bit rate is a rate at which a signal (represented by a digital binary bit) is processed or transmitted by a system (a device, a radio wave, or a wire), that is, a volume of data processed or transmitted in a unit time. The unit is "bit per second" (bit/s or bps). The bit rate can be used to indicate a connection speed, a transmission speed, a channel capacity, a maximum throughput, a digital bandwidth capacity, and the like in the communication field. In the present disclosure, the bit rate can be used to indicate a bus rate for transmission between a controller and a NAND flash.

In addition, the "margin effective width" may also be referred to as an effective width of a timing margin. This is equivalent to the foregoing "timing margin" and a difference lies only in that in the present disclosure, a concept of a "margin effective width" is defined to measure the "timing margin". Herein, "margin" in the present disclosure may refer to the "margin effective width". Therefore, unless otherwise specified, the timing margin in this embodiment may be understood as an effective width of the timing margin.

An embodiment of the present disclosure provides a method for optimizing a flash memory chip. According to the method, a voltage margin and a timing margin are optimized in a service running process of a flash memory chip, to reduce a data transmission bit error rate and improve reliability of the flash memory chip.

The technical solutions of the present disclosure may be applied to a device provided with a NAND flash chip, provided that the device has a structure shown in FIG. 2. In other words, in addition to the SSD shown in FIG. 1, the basic solution of the present disclosure may also be applied to other devices that communicate with the NAND flash chip through the NFI bus, for example, an add-in card (AIC), a secure digital card (SD card), and an electronic device (for example, a mobile phone, a tablet computer, a digital camera, or an ECU) that uses the NAND flash chip as a storage medium.

Figure 6:
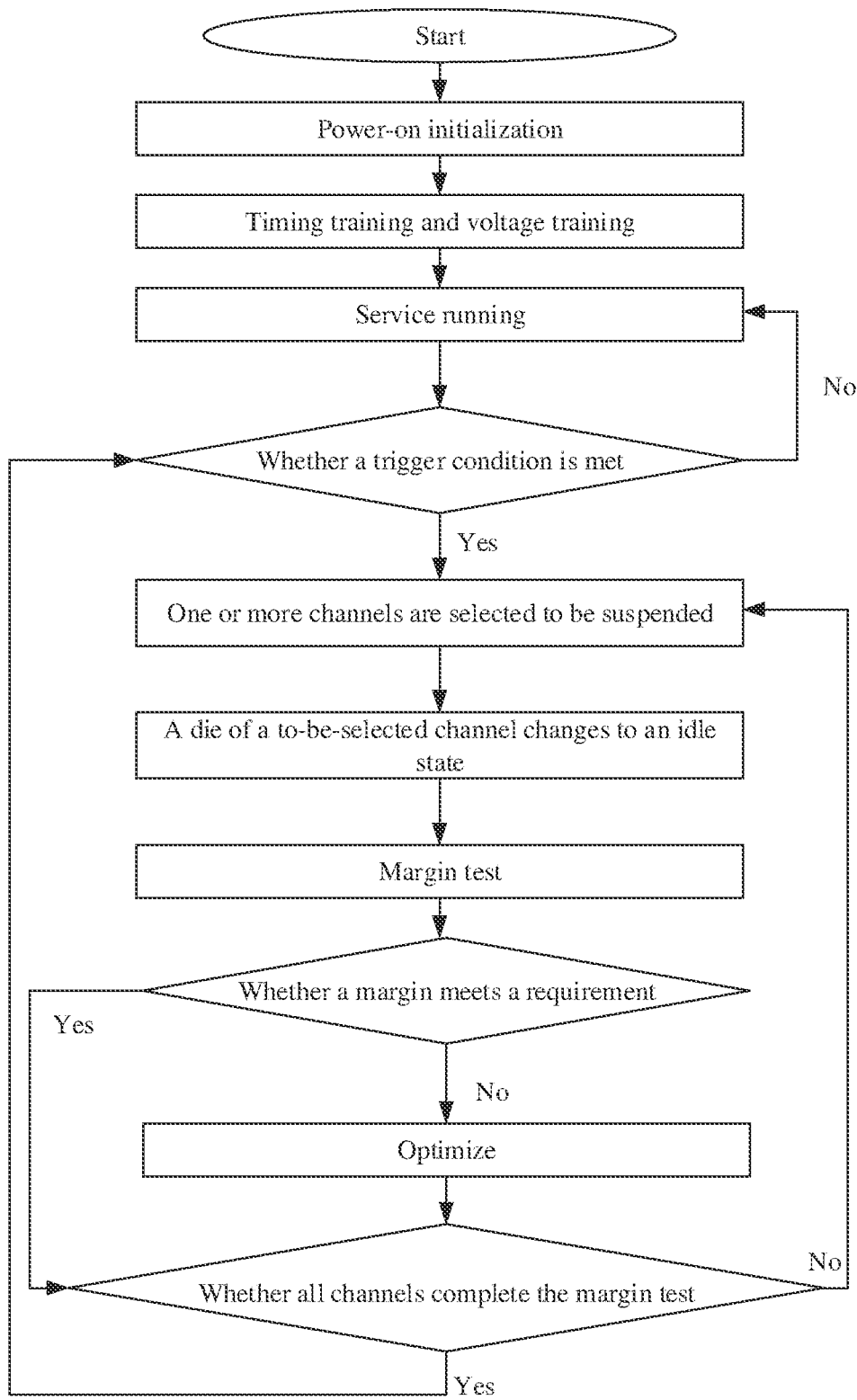
FIG. 6 is a schematic flowchart of a method for optimizing a flash memory chip according to an embodiment of the present disclosure.

FIG. 6 is a schematic flowchart of a method for optimizing a flash memory chip according to an embodiment of the present disclosure.

As shown in FIG. 6, after completing power-on initialization, timing training, and voltage training, the flash memory chip starts a service running phase (that is, may read data stored in the flash memory chip, write data to the flash memory chip, delete data from the flash memory chip, or the like). In a service running process, whether a trigger condition is met is determined; if the trigger condition is not met, monitoring is continued; if the trigger condition is met, one or more channels of the flash memory chip are selected and suspended; and after a die of a selected channel changes to an idle state, a margin test is performed on the selected channel, to determine whether a margin of the selected channel meets a requirement. If the margin of the selected channel does not meet the requirement, the channel may be optimized; or if the margin of the selected channel meets the requirement, it is determined whether a margin test has been performed on all channels of the flash memory chip. If no, a margin test continues to be performed on a remaining channel; or if the margin test has been performed on all the channels, whether the trigger condition is met continues to be monitored.

The following describes, with reference to the NAND flash chip 131 shown in FIG. 5, the schematic flowchart of the method for optimizing the flash memory chip according to this embodiment shown in FIG. 6.

It is assumed that the NAND flash chip 131 is powered on at the moment to, the power-on initialization is completed at the moment t1, and the timing training and the voltage training are completed at the moment t2. In this case, from the moment t2, it may be considered that the NAND flash chip 131 is in the service running phase. In other words, from the moment t2, a read/write operation may be performed on the NAND flash chip 131, or data in the NAND flash chip 131 may be deleted.

In some embodiments, working environmental data may be monitored, and whether the trigger condition is met is determined based on the monitored working environmental data. The working environmental data may include a temperature and/or humidity. Temperature monitoring may be implemented by using a temperature sensor, and humidity monitoring may be implemented by using a humidity sensor.

For example, a temperature upper limit may be set, and if a monitored temperature is greater than the temperature upper limit, it may be determined that the trigger condition is met. For another example, a temperature upper limit and a temperature lower limit may be set. If a monitored temperature is greater than the temperature upper limit or less than the temperature lower limit, it may be determined that the trigger condition is met.

For another example, a temperature upper limit and a humidity upper limit may be set. If both a monitored temperature and monitored humidity meet the corresponding upper limit at the same time (that is, the temperature meets the temperature upper limit and the humidity meets the humidity upper limit), it may be determined that the trigger condition is met. If at least one of the monitored temperature and the monitored humidity does not meet the corresponding upper limit (for example, the temperature is greater than the temperature upper limit, but the humidity is less than the humidity upper limit), it may be determined that the trigger condition is not met.

A temperature compared with a temperature threshold may be a real-time temperature monitored by the temperature sensor, or may be an average temperature value in a period of time. Similarly, humidity compared with a humidity threshold may be real-time humidity monitored by the humidity sensor, or may be a humidity average value within a period of time.

In some other embodiments, a working parameter of the NAND flash chip 131 may be monitored, and whether the trigger condition is met is determined based on the monitored working parameter. The working parameter may include one or more of a working voltage, a data transmission volume, a current status of a channel, or the like. The working voltage may be a working voltage of the NAND flash chip 131, or may be an interface voltage for transmitting data.

For example, a data transmission volume lower limit may be set. If a data transmission volume of the NAND flash chip 131 is less than the data transmission volume lower limit, it may be determined that the trigger condition is met.

For another example, if it is determined that the NAND flash chip 131 has a channel in an idle state or a quantity of channels in an idle state is greater than a preset quantity, it may be determined that the trigger condition is met.

In some other embodiments, a timer may be set. If the timer expires, it may be determined that the trigger condition is met. In addition, the timer may be restarted after all the channels complete the margin test.

In some other embodiments, a plurality pieces of the working environmental data, the working parameter, or the timer may be simultaneously monitored to determine whether the trigger condition is met.

In some embodiments, it may be determined that the trigger condition is met only when a plurality of pieces of monitored data each meets a corresponding condition at the same time. For example, a temperature of a storage device and the timer are monitored at the same time. If the temperature of the storage device is greater than a preset upper temperature limit and the timer expires, it may be determined that the trigger condition is met; or if the temperature of the storage device is greater than the preset upper temperature limit but the timer does not expire, it may be determined that the trigger condition is not met.

In some other embodiments, it may be determined that the trigger condition is met when any one of the plurality of pieces of monitored data meets the corresponding condition. For example, the temperature of the storage device and the timer are monitored at the same time. If the temperature of the storage device is greater than the preset upper temperature limit and/or the timer expires, it may be determined that the trigger condition is met; or if the temperature of the storage device is less than the preset upper temperature limit and the timer does not expire, it may be determined that the trigger condition is not met.

When the trigger condition is met, one or more channels may be selected to be suspended.

In some embodiments, a suspended channel may be randomly selected.

In some other embodiments, a suspended channel may be selected based on a data transmission volume of the channel. For example, a channel in an idle state may be first selected, and then a channel that is performing service read/write is selected. For another example, a channel with a relatively low data transmission volume may be first selected, and then a channel with a relatively high data service flow is selected.

If a quantity of selected suspended channels is less than a total quantity of channels, a channel that is not selected continues to work normally.

It is assumed that the channel 502 and the channel 503 shown in FIG. 5 are selected to be suspended. In this case, a normal read/write operation may be performed on the die 521 to the die 524 through the channel 504 and the channel 505.

After the channel 502 and the channel 503 are suspended, states of dies corresponding to the channel 502 and the channel 503 may be changed to idle states. It is assumed that states of the die 511 and the die 512 change to idle states, and a margin test may be performed on the channel 502. After the margin test is performed on the channel 502, if the die 513 and the die 514 are in idle states, the margin test may be performed on the channel 503.

The margin test can be classified into a timing margin test and a voltage margin test. The channel 502 is used as an example to describe the margin test.

In some embodiments, performing a margin test on the channel 502 may be performing a timing margin test only on the channel 502. In this case, if the channel 502 passes the timing margin test, it may be determined that the channel 502 does not need to be optimized; or if the channel 502 does not pass the timing margin test, it may be determined that the channel 502 is a to-be-optimized channel.

In some other embodiments, performing a margin test on the channel 502 may be performing a voltage margin test only on the channel 502. In this case, if the channel 502 passes the voltage margin test, it may be determined that the channel 502 does not need to be optimized; or if the channel 502 does not pass the voltage margin test, it may be determined that the channel 502 is a to-be-optimized channel.

In some other embodiments, performing a margin test on the channel 502 may be performing a timing margin test and a voltage margin test on the channel 502.

In a case in which both the timing margin test and the voltage margin test are performed on the channel 502, whether the channel 502 passes the margin test may be determined in a plurality of manners.

In an implementation, only when both tests are passed, it can be determined that the channel 502 passes the margin test. In other words, if the channel 502 does not pass the timing margin test or the channel 502 does not pass the voltage margin test, it may be determined that the channel 502 does not pass the margin test.

In another implementation, provided that one of the two margin tests is passed, it may be determined that the channel 502 passes the margin test. In other words, if the channel 502 passes the timing margin test or the channel 502 passes the voltage margin test, it may be determined that the channel 502 passes the margin test. In this case, two margin tests may be performed in sequence. If the margin test performed first passes, the other margin test may not be performed. For example, the timing margin test is first performed on the channel 502. If the channel 502 passes the timing margin test, it may be directly determined that the channel 502 passes the margin test, and it is unnecessary to continue to perform the voltage margin test on the channel 502. If the channel 502 does not pass the timing margin test, the voltage margin test is performed on the channel 502. If the channel 502 passes the voltage margin test, it may be determined that the channel 502 passes the margin test. If the channel 502 does not pass the voltage margin test, it may be determined that the channel 502 does not pass the margin test.

With reference to FIG. 7 to FIG. 10, the following describes a timing margin test and a voltage margin test.

Figure 7:
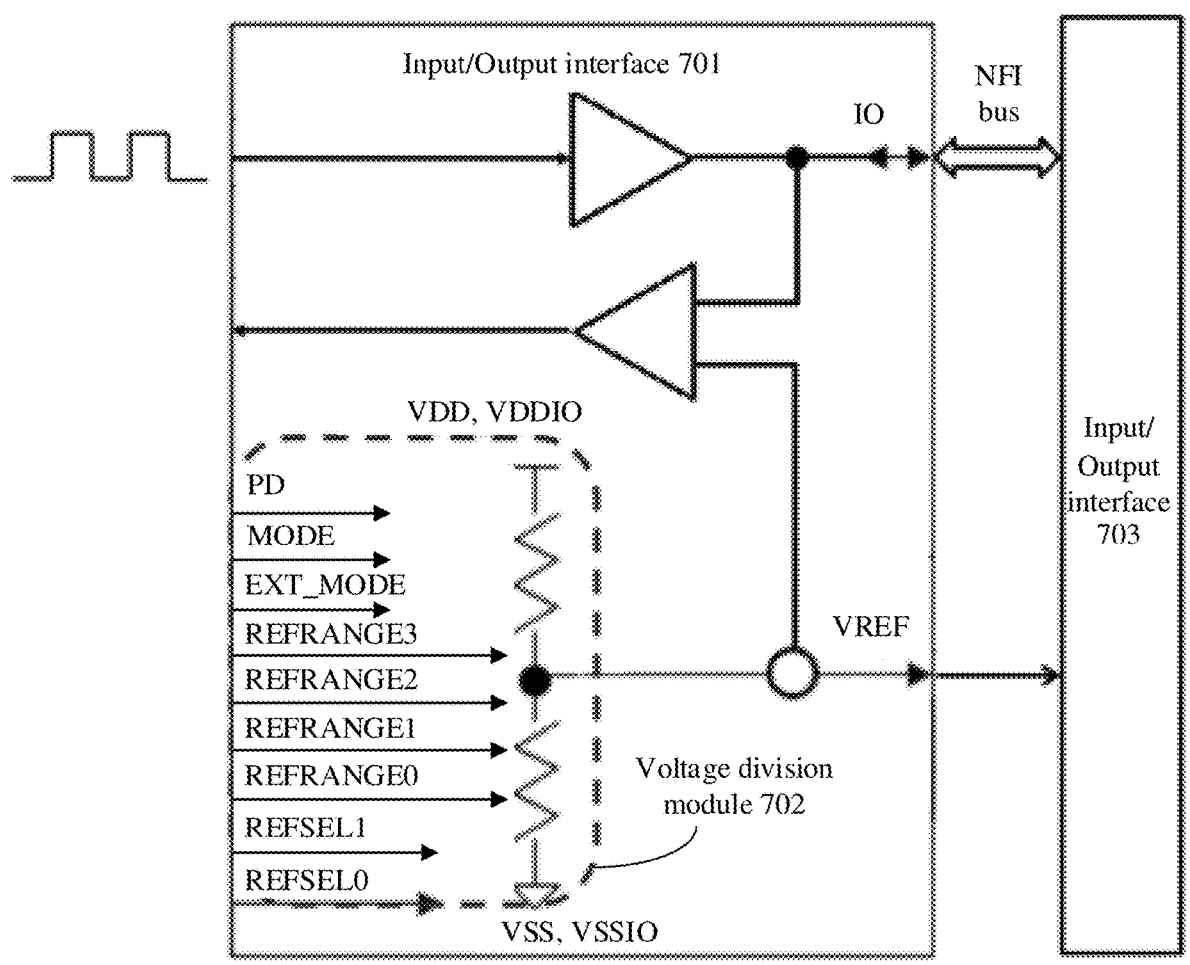
FIG. 7 is a schematic diagram of a connection between a flash memory controller and a die.

FIG. 7 is a schematic diagram of a connection between a flash memory controller and a die. An input/output interface 701 shown in FIG. 7 is an input/output interface of the flash memory controller. An input/output interface 703 shown in FIG. 7 is an input/output interface of the die.

As shown in FIG. 7, the input/output interface 701 includes a voltage division module 702. The voltage division module 702 may implement the timing margin test.

Figure 8:
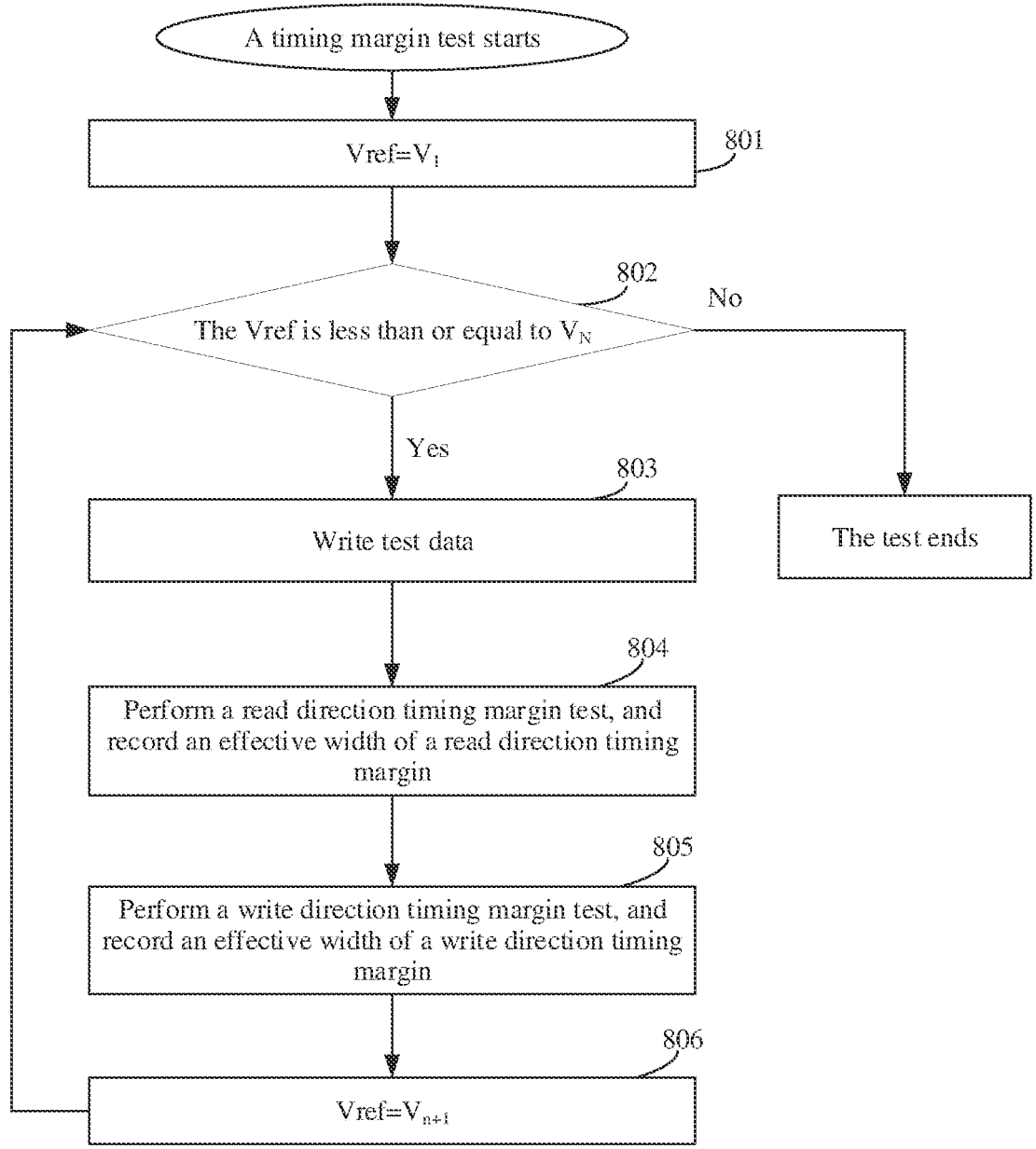
FIG. 8 is a flowchart of a timing margin test.

FIG. 8 is a flowchart of the timing margin test. It is assumed that the voltage division module 702 may set N levels of a reference voltage Vref (N is a positive integer greater than or equal to 2). Voltages at the N levels may be respectively represented by $V_1, V_2, \ldots,$ and $V_N$.

801: Set a level of the Vref to $V_1$.

802: Determine whether a current level of the Vref is less than or equal to the $V_N$. If the current level of the Vref is less than or equal to the maximum level $V_N$ of the reference voltage, continue to perform subsequent steps of the timing margin test.

803: Write test data to a NAND flash chip.

Optionally, the test data may be written to the NAND flash chip at a relatively low rate. In this way, a probability of errors when writing can be reduced. For example, Table 1 shows a correspondence between an NFI bus working mode and a rate in this embodiment. Different working modes correspond to different bus rates.

TABLE 1

| Mode | Rate (Mpbs) |
| --- | --- |
| SDR | 10-50 |
| NV-DDR | 40-200 |
| NV-DDR2 | 66-800 |
| NV-DDR3 | 66-1200 |

For example, the bus rate corresponding to the NV-DDR working mode is 40-200 million bits per second (Mbps), and a low rate corresponding to the NV-DDR working mode may be 40 Mbps or 48 Mbps.

Data written to the NAND flash chip may be data that is prone to a transmission error, for example, 0x5AA55AA5 or 0xA55AA55A. The test data may be written to a cache register of the NAND flash chip. Writing the test data to the cache register of the NAND flash chip instead of another deeper area (for example, a data register or a NAND flash array) may reduce a probability that an error occurs during data transmission in the NAND flash chip.

804: Perform a read direction timing margin test, and record an effective width of the read direction timing margin.

After the test data is written to the NAND flash chip, the test data written in step 803 may be read. In a process of reading the test data, a read direction effective eye width a DQ signal is recorded to obtain an effective width Trx1 of a read direction timing margin at the current level.

805: Perform a write direction timing margin test, and record an effective width of the write direction timing margin.

After the read direction timing margin test is completed, the test data is written at a normal rate to perform the write direction timing margin test. In a process of writing the test data, a write direction effective eye width of the DQ signal is recorded to obtain an effective width Ttx1 of a write direction timing margin at the current level.

806: Set the level of the Vref to a next level, that is, Vref=$V_{n+1}$, and continue to perform the read direction timing margin test and the write direction timing margin test, to sequentially obtain read direction timing effective widths at the N levels and write direction timing effective widths at the N levels.

After the read direction timing effective widths at the N levels and the write direction timing effective widths at the N levels are obtained, whether the timing margin test is passed may be determined based on the read direction timing effective widths at the N levels and the write direction timing effective widths at the N levels. For ease of description, the read direction timing effective width at the N levels may be referred to as N read timing effective widths, and the write direction timing effective widths at the N levels may be referred to as N write timing effective widths.

In some embodiments, if both the N read timing effective widths and the N write timing effective widths pass the timing margin test, it may be considered that the channel passes the timing margin test. In other words, if any one of the N read timing effective widths and the N write timing effective widths does not pass the margin test, it may be considered that the channel does not pass the timing margin test.

In some embodiments, the read direction timing effective widths at the N levels each correspond to a threshold range. For example, it is assumed that the read direction timing effective widths at the N levels each are separately Trx1, Trx2, . . . , and TrxN. A threshold range of Trx1 is [Th1_Trx1, Th2_Trx1], a threshold range of Trx2 is [Th1_Trx2, Th2_Trx2], . . . , and a threshold range of TrxN is [Th1_TrxN, Th2_TrxN]. If a read direction timing effective width at a level is within a corresponding threshold range, it may be considered that the read direction timing effective width at this level can pass the timing margin test. Similarly, the write direction timing effective widths at the N levels each correspond to a threshold range. For example, it is assumed that the write direction timing effective widths at the N levels each are separately Ttx1, Ttx2, and TtxN. A threshold range of Ttx1 is [Th1_Ttx1, Th2_Ttx1], a threshold range of Ttx2 is [Th1_Ttx2, Th2_Ttx2], . . . , and a threshold range of TrxN is [Th1_TtxN, Th2_TtxN]. If a write direction timing effective width at a level is within a corresponding threshold range, it may be considered that the write direction timing effective width at this level can pass the timing margin test.

In some other embodiments, the read direction timing effective timing widths at the N levels each have a lower limit value. If a read direction timing effective width at a level exceeds a lower limit value corresponding to the level, it may be considered that the read direction timing effective width at the level can pass the timing margin test. Similarly, the write direction timing effective widths at the N levels each have a lower limit value. If a write direction timing effective width at a level exceeds a lower limit value corresponding to the level, it may be considered that the write direction timing effective width at the level can pass the timing margin test.

In some other embodiments, if a level that passes the timing margin test exceeds a preset ratio, it may be considered that the channel passes the timing margin test.

In some embodiments, level ratios of a margin test that is passed in a read direction and in a write direction are separately counted. The two level ratios are separately compared with the preset ratio. If both the two level ratios exceed the preset ratio, it may be considered that the channel passes the timing margin test.

For example, it is assumed that the preset ratio is 50%, a read direction timing effective width of 75% levels passes the timing margin test, and a write direction timing effective width of 90% levels passes the timing margin test. In this case, it may be considered that the channel passes the timing margin test.

For another example, it is assumed that the preset ratio is 50%, a read direction timing effective width of 75% levels passes the timing margin test, and a write direction timing effective width of 40% levels passes the timing margin test. In this case, it may be considered that the channel does not pass the timing margin test.

In some other embodiments, a ratio of total levels that pass the timing margin test may be counted. If the ratio of the total levels exceeds the preset ratio, it may be considered that the channel passes the timing margin test. Otherwise, it is considered that the channel does not pass the timing margin test.

For example, it is assumed that N is equal to 10, the preset ratio is 50%, read direction timing effective widths at three levels pass the timing margin test, and write direction timing effective widths at eight levels pass the timing margin test. The ratio of the total levels that pass the timing margin test is (3+8)/(10+10)=11/20. It can be learned that the ratio of the total levels that pass the timing margin test is greater than 50%. Therefore, it may be considered that the channel passes the timing margin test.

In some other embodiments, two preset thresholds may be set, and the two preset thresholds may be respectively referred to as a preset timing threshold 1 and a preset timing threshold 2. After the N read timing effective widths and the N write timing effective widths are determined, a maximum value (which may be represented by Max_rx) of the N read timing effective widths and a maximum value (which may be represented by Max_tx) of the N write timing effective widths may be determined. If Max_rx is not greater than the preset timing threshold 1, and Max_tx is not greater than the preset timing threshold 2, it may be considered that the channel passes the timing margin test. If Max_rx is greater than the preset timing threshold 1 or Max_tx is greater than the preset timing threshold 2, it may be considered that the channel does not pass the timing margin test.

In some other embodiments, a maximum value of the N read timing effective widths and the N write timing effective widths may be determined. If the maximum value is not greater than a preset threshold, it may be considered that the channel passes the timing margin test; or if the maximum value is greater than the preset threshold, it may be considered that the channel does not pass the timing margin test.

In the foregoing embodiment, the maximum value of the timing effective width is compared with the preset threshold. In some other embodiments, an average value of the timing effective width may be further determined, and whether the channel passes the timing margin test is determined by comparing the determined average value with the preset threshold.

For example, in some embodiments, an average value (which may be represented by Avg_rx) of the N read timing effective widths and an average value (which may be represented by Avg_tx) of the N write timing effective width may be counted. If Avg_rx is not greater than a preset threshold (which may be referred to as a preset timing threshold 3) and Avg_tx is not greater than another preset threshold (which may be referred to as a preset timing threshold 4), it may be considered that the channel passes the timing margin test; or if Avg_rx is greater than the preset timing threshold 3 or Avg_tx is greater than the preset timing threshold 4, it may be considered that the channel does not pass the timing margin test.

In some other embodiments, an average value of the N read timing effective widths and the N write timing effective widths may be counted. If the average value is not greater than a preset threshold, it may be considered that the channel passes the timing margin test; or if the average value is greater than the preset threshold, it may be considered that the channel does not pass the timing margin test.

Figure 9:
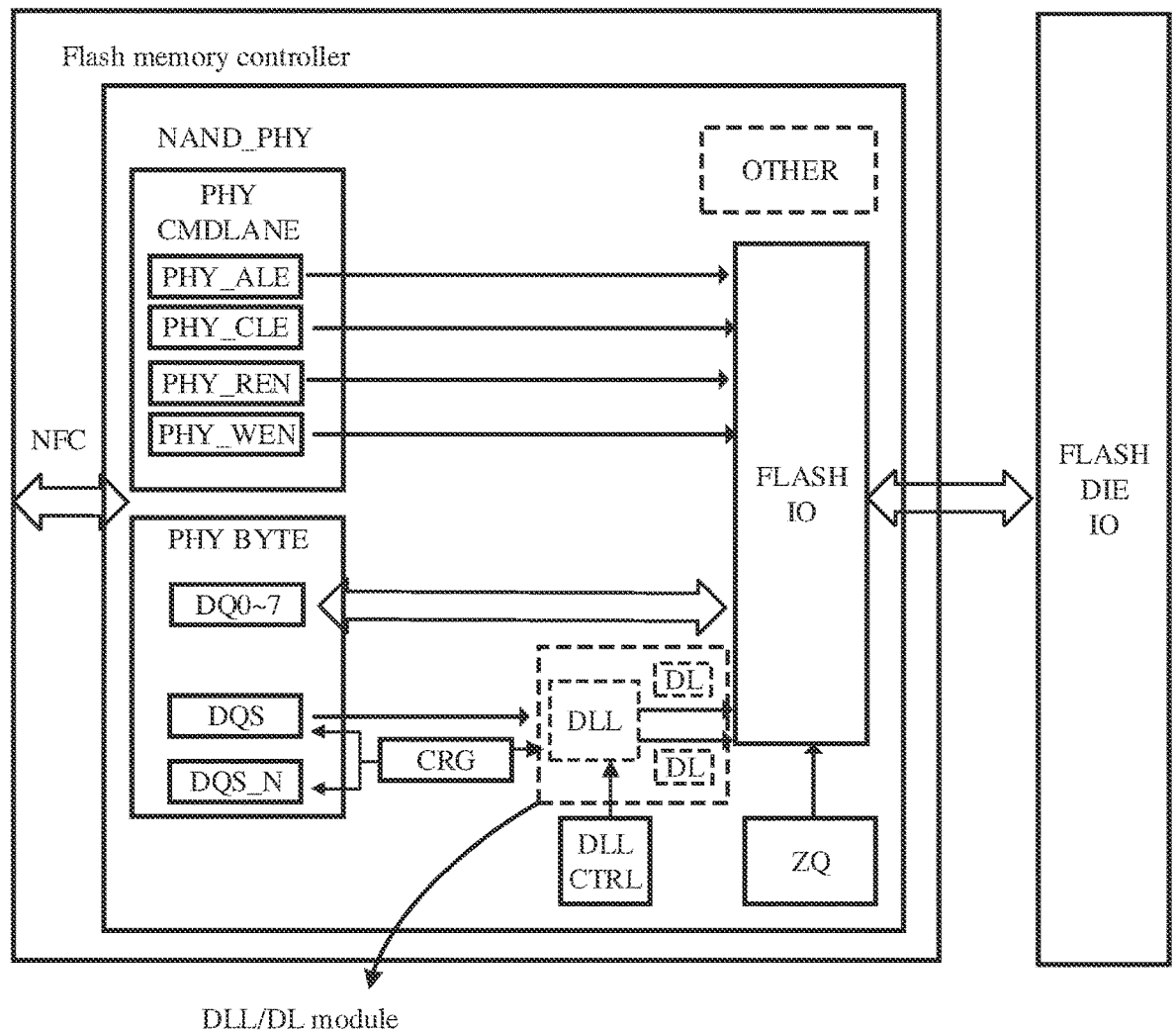
FIG. 9 is a schematic diagram of a flash memory controller.

FIG. 9 is a schematic diagram of a flash memory controller. The voltage margin test may be implemented through a delay locked loop (DLL) and a delay line (DL) in a DLL/DL module in the flash memory controller shown in FIG. 9.

Figure 10:
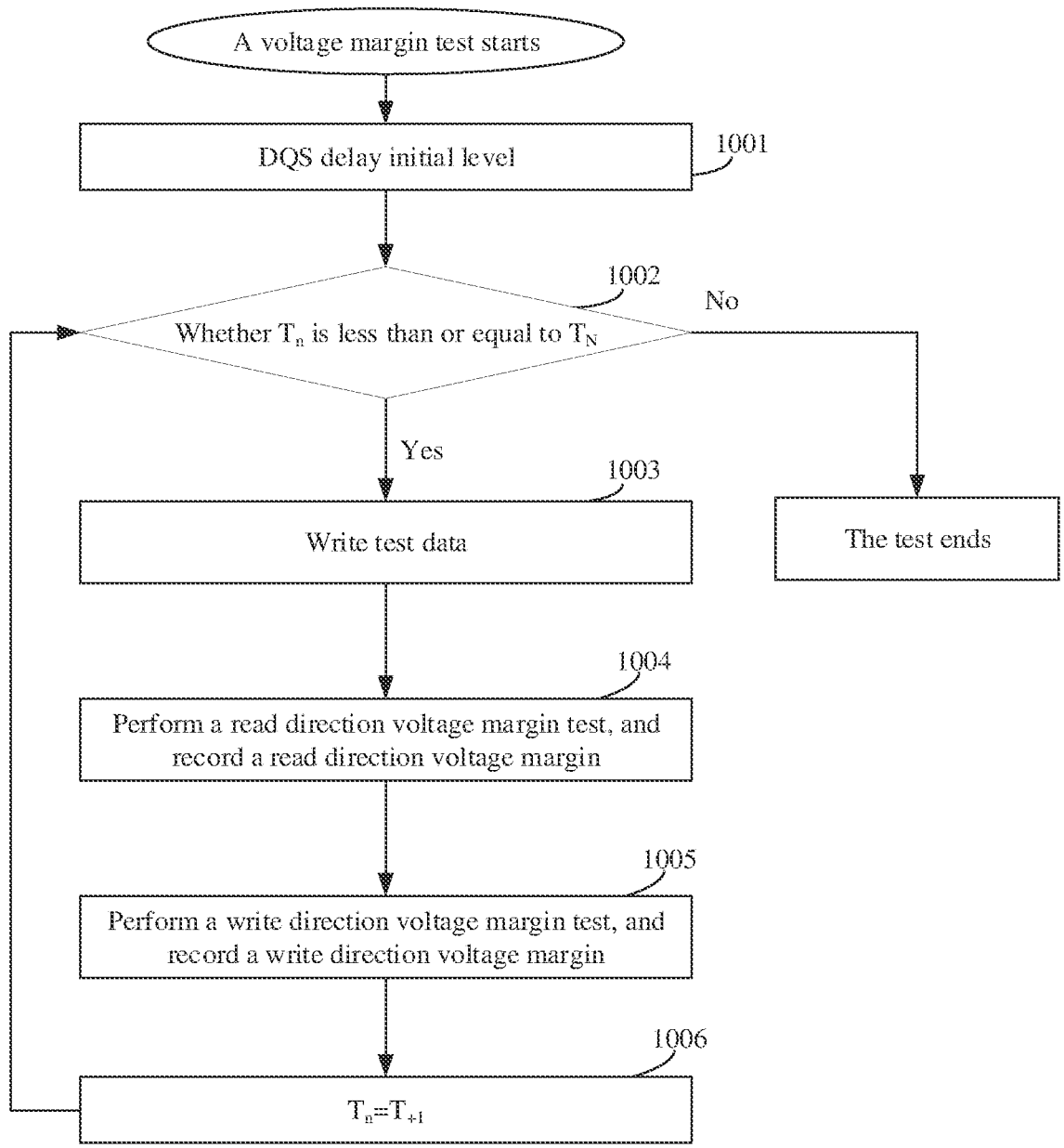
FIG. 10 is a schematic flowchart of a voltage margin test.

FIG. 10 is a schematic flowchart of the voltage margin test. It is assumed that the DLL/DL module shown in FIG. 10 may set a quantity of DQS delay levels to N (N is a positive integer greater than or equal to 2). Delays at the N levels may be respectively represented by $T_1, T_2, \ldots,$ and $T_N$.

1001: Set an initial level of a DQS delay to $T_1$.

1002: Determine whether a current level of the DQS delay is less than or equal to $T_N$. If the current level of the DQS delay is less than or equal to the maximum delay level $T_N$, subsequent steps of the voltage margin test continue to be performed.

1003: Write test data to a NAND flash chip.

Similar to the timing margin test process in FIG. 8, the test data may also be written to the NAND flash chip at a relatively low rate. The test data can also be error-prone. A position of the written test data may also be a cache register in the NAND flash chip.

1004: Perform a read direction voltage margin test, and record a read direction voltage margin.

After the test data is written to the NAND flash chip, the written test data may be read. In a process of reading the test data, a high electrical level Vrx1h and a low electrical level Vrx1l in a read direction at the current level are obtained, and a sum of Vrx1h and Vrx1l is determined as the voltage margin Vrx1 in the read direction at the current level.

1005: Perform a write direction voltage margin test, and record a write direction voltage margin.

In a process of writing the test data, a high electrical level Vtx1h and a low electrical level Vtx1l in a write direction at the current level are obtained, and a sum of Vtx1h and Vtx1l is determined as the voltage margin Vtx1 in the write direction at the current level.

1006: Set the DQS delay level to a next level, that is, $T_{n+1}$, and continue to perform the read direction voltage margin test and the write direction voltage margin test, to sequentially obtain read direction voltage margins at the N levels and write direction voltage margins at the N levels.

After the read direction voltage margins at the N levels and the write direction voltage margins at the N levels are obtained, whether the voltage margin test is passed may be determined based on the read direction voltage margins at the N levels and the write direction voltage margins at the N levels. For ease of description, the read direction voltage margins at the N levels may be referred to as N read voltage margins, and the write direction voltage margins at the N levels may be referred to as N write voltage margins.

A manner for determining whether a channel passes the voltage margin test is similar to the manner of determining whether the channel passes the timing margin test.

For example, in some embodiments, each voltage margin may have a corresponding threshold range. If both the N read voltage margins and the N write voltage margins are within corresponding threshold ranges, it may be determined that the channel passes the voltage margin test; or if a voltage margin is not within the corresponding threshold range, it may be determined that the channel does not pass the margin test.

For another example, in some embodiments, a maximum value of the N read voltage margins may be compared with a preset threshold, a maximum value of the N write voltage margins may be compared with the preset threshold, and whether the channel passes the margin test is determined based on a comparison result.

For another example, in some other embodiments, the threshold may be compared with an average value of the voltage margins.

For a specific implementation of determining whether the channel passes the voltage margin test, refer to the description of determining whether the channel passes the timing margin test.

It is assumed that the channel 502 passes the margin test, and the channel 503 does not pass the margin test. In this case, it may be determined that the channel 503 is a to-be-optimized channel. In this case, the channel 502 does not need to be optimized, and the channel 503 needs to be optimized. The following describes a channel optimization process with reference to FIG. 11 to FIG. 12.

Channel optimization may be classified into voltage margin optimization and timing margin optimization.

In some embodiments, both voltage margin optimization and timing margin optimization may be performed on a to-be-optimized channel (for example, the channel 503).

In some other embodiments, only voltage margin optimization or only the timing margin optimization may be performed on the to-be-optimized channel (for example, the channel 503).

For example, if the channel 503 passes the voltage margin test but does not pass the timing margin test, timing margin optimization may be performed on the channel 503.

For another example, if the channel 503 passes the timing margin test but does not pass the voltage margin test, voltage margin optimization may be performed on the channel 503.

Figure 11:
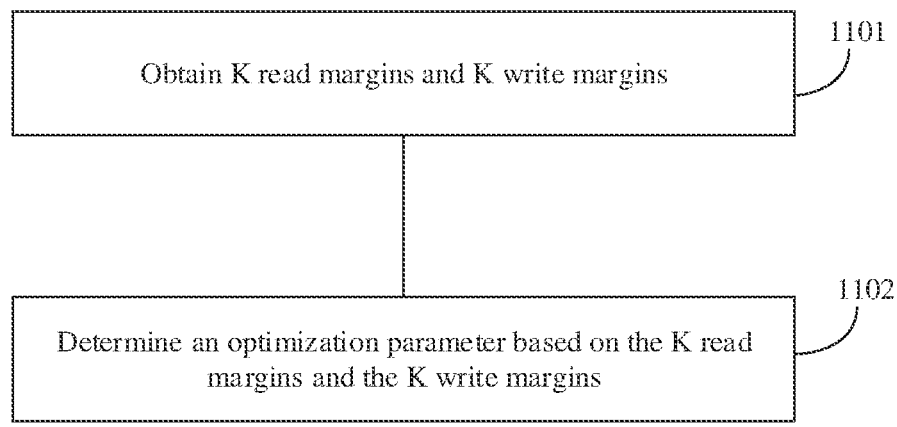
FIG. 11 is a schematic flowchart of voltage margin optimization according to an embodiment of the present disclosure.

FIG. 11 is a schematic flowchart of voltage margin optimization according to an embodiment of the present disclosure.

1101: Obtain K read margins and K write margins, where the K read margins are in a one-to-one correspondence with K levels, the K write margins are in a one-to-one correspondence with the K levels, and K is a positive integer greater than 1.

As described above, in a process of performing a timing margin test, read direction timing margin effective widths at N voltage levels and write direction timing margin effective widths at the N levels may be extracted.

In some embodiments, K voltage levels (K is a positive integer greater than 1 and less than N) and read direction timing margin effective widths and write direction timing margin effective widths corresponding to the K voltage levels may be selected from the N voltage levels. The selected K voltage levels are the K levels in step 1101, the read direction timing margin effective widths corresponding to the K voltage levels are the K read margins in step 1101, and the write direction timing margin effective widths corresponding to the K voltage levels are the K write margins in step 1101.

There may be a plurality of manners for selecting the K voltage levels from the N voltage levels. For example, the K voltage levels may be randomly selected. For another example, K voltage levels corresponding to largest K read direction timing margin effective widths that are of the read direction timing margin effective widths may be selected, where K may be a preset value or a positive integer calculated based on a preset ratio. For another example, K voltage levels corresponding to largest K write direction timing margin effective widths that are of the write direction timing margin effective widths may be selected, where K may be a preset value or a positive integer calculated based on a preset ratio.

In some other embodiments, the K levels may be the same as the N voltage levels. In other words, in step 1101, the N voltage levels and a read direction timing margin effective width and a write direction timing margin effective width of each voltage level that are obtained in the timing margin test may be directly used. In this case, a value of K is the same as that of N.

If the K levels are the K voltage levels, the K read margins may also be referred to as K read timing margins, and the K write margins may also be referred to as K write timing margins.

As described above, in a process of performing a voltage margin test, read direction voltage margins and write direction voltage margins at N DQS delay levels may be obtained.

Similarly, in some embodiments, K DQS delay levels (K is a positive integer greater than 1 and less than N) and read direction voltage margins and write direction voltage margins corresponding to the K DQS delay levels may be selected from the N DQS delay levels. The selected K DQS delay levels are the K levels in step 1101, the read direction voltage margins corresponding to the K DQS delay levels are the K read margins in step 1101, and the write direction voltage margins corresponding to the K DQS delay levels are the K write margins in step 1101.

There may be a plurality of manners for selecting the K DQS delay levels from the N DQS delay levels. For example, the K DQS delay levels may be randomly selected. For another example, K voltage levels corresponding to largest K read direction voltage margins that are of the read direction voltage margins may be selected, where K may be a preset value or a positive integer calculated based on a preset ratio. For another example, K voltage levels corresponding to largest K direction voltage margins that are of the write direction voltage margins may be selected, where K may be a preset value or a positive integer calculated based on a preset ratio.

In some other embodiments, the K levels may be the same as the N DQS delay levels. In other words, in step 1101, the N DQS delay levels and a read direction voltage margin and a write direction voltage margin of each DQS delay level that are obtained in the voltage margin test may be directly used. In this case, a value of K is the same as that of N.

If the K levels are the K DQS delay levels, the K read margins may also be referred to as K read voltage margins, and the K write margins may also be referred to as K write voltage margins.

1102: Determine an optimization parameter based on the K read margins and the K write margins that are obtained in step 1101.

A read optimization voltage may be determined based on K read margins, and a write read voltage may be determined based on K write margins.

For example, the read optimization voltage may be determined according to the following formula:

$$\mathrm{V}rx\_\mathrm{best} = \frac{V_1 \times T_{rx1} + V_2 \times T_{rx2} + \cdots + V_K \times T_{rxK}}{T_{rx1} + T_{rx2} + \ldots + T_{rxK}} \qquad \text{Formula 11.1}$$

Herein, Vrx_best represents the read optimization voltage, $V_k$ represents the $k^{th}$ voltage level in the K voltage levels, $T_{rx1}$ represents the $k^{th}$ read timing margin in the K read timing margins, and k=1, . . . , K.

The write optimization voltage may be determined according to the following formula:

$$\mathrm{V}tx\_\mathrm{best} = \frac{V_1 \times T_{tx1} + V_2 \times T_{tx2} + \cdots + V_K \times T_{txK}}{T_{tx1} + T_{tx2} + \ldots + T_{txK}} \qquad \text{Formula 11.2}$$

Herein, Vtx_best represents the write optimization voltage, $V_k$ represents the $k^{th}$ voltage level in the K voltage levels, and $T_{tx1}$ represents the $k^{th}$ write timing margin in the K write timing margins.

For another example, the read optimization voltage may be an arithmetic average value of the K read direction voltage margins, that is, the read optimization voltage may be determined according to the following formula:

$$\mathrm{V}rx\_\mathrm{best} = \frac{V_{rx1} + V_{rx2} + \cdots + V_{rxK}}{K} \qquad \text{Formula 11.3}$$

Herein, Vrx_best represents the read optimization voltage, $V_{rxk}$ represents the $k^{th}$ read voltage margin in the K read voltage margins, and k=1, ..., K.

The write optimization voltage may be an arithmetic average value of K write direction voltage margins, that is, the write optimization voltage may be determined according to the following formula:

$$V tx\_best = \frac{V_{tx1} + V_{tx2} + \cdots + V_{txK}}{K} \quad \text{Formula 11.4}$$

Herein, Vtx_best represents the read optimization voltage, $V_{txk}$, represents the $k^{th}$ write voltage margin in the K write voltage margins, and k=1, ..., K.

In the foregoing embodiment, in processes of determining the read optimization voltage and the write optimization voltage, all read margins and write margins determined in step 1101 are used. In some other embodiments, in the processes of determining the read optimization voltage and the write optimization voltage, some read margins and write margins determined in step 1101 may also be used. For example, after a maximum read margin, a minimum read margin, a maximum write margin, and a minimum write margin are excluded, remaining read margins are averaged to obtain the read optimization voltage, and remaining write margins are averaged to obtain the write voltage margin.

In the foregoing embodiment, a read reference voltage and a write reference voltage can be optimized, a probability of an error in transmission between a flash memory controller and a NAND flash chip is reduced, and storage performance is improved.

Figure 12:
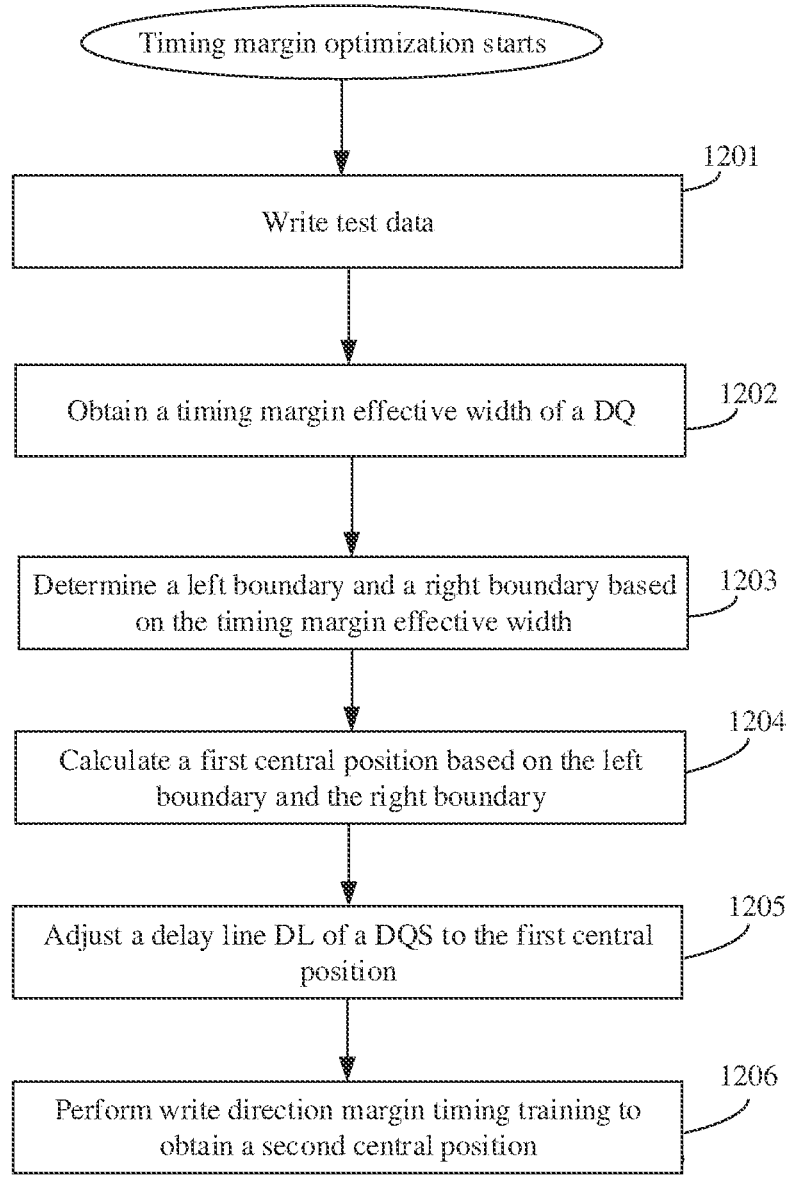
FIG. 12 is a schematic flowchart of timing margin optimization according to an embodiment of the present disclosure.

FIG. 12 is a schematic flowchart of timing margin optimization according to an embodiment of the present disclosure.

1201: Write test data to a NAND flash chip.

Similar to the timing margin test process in FIG. 8, the test data may also be written to the NAND flash chip at a relatively low rate. The test data can also be error-prone. A position of the written test data may also be a cache register in the NAND flash chip.

1202: Obtain a timing margin effective width of a DQ.

1203: Determine a left boundary (L_Boundary) and a right boundary (R_Boundary) based on the timing margin effective width, where the left boundary is a maximum value in minimum values of timing margin effective widths of all DQs, and the right boundary is a minimum value in maximum values of all corresponding timing margin effective widths when all the DQs are aligned with the left boundary.

1204: Calculate a first central position based on the left boundary and the right boundary. During read data training, the first central position is a center of a minimum margin effective width obtained after all the DQs are aligned.

The first central position is an average value of the left boundary and the right boundary, that is, center point=–(L_Boundary–R_Boundary)/2.

1205: Adjust a delay line (DL) of a DQS to the first central position, so that an edge of a DQS signal is located at a center point of the margin effective width of the DQ.

In addition, the method further includes: assigning a delay line (DL) value corresponding to the first central position to a DQS register; and assigning a DL value of each DQ to a corresponding DQ register. The DL value of each DQ is a value obtained by converting a length that needs to be adjusted for aligning each DQ with the edge of the DQS into a scale unit corresponding to the DQ.

Optionally, a scale of the DQS is different from a scale of the DQ. Specifically, the DQS signal has relatively more scale values. For example, there are a total of 1024 tap numbers, and a time represented by a unit scale is determined by a DQS cycle, that is, a DQS cycle measured by a DLL is divided by 1024. The DQ signal has relatively fewer scale values. For example, there are a total of 20 tap numbers, and a time represented by a unit scale is fixed (determined by precision of a hardware circuit). Further, the scale unit may be set to 5 ps, 10 ps, 20 ps, or the like.

A parameter used to adjust the delay line of the DQS to the first central position may be referred to as a read optimization DQS timing optimization parameter.

1206: Perform write direction margin timing training to obtain a second central position. During write data training, the second central position is a center of a minimum margin effective width obtained after all the DQs are aligned.

After read direction training is completed, preset data or custom data is written at a normal rate, then a read command is sent to read the data that is just written, and write direction timing training is performed.

The preset data or the custom data that is written may be the same as or different from preset data in a read direction. This is not limited in this embodiment.

After write direction training is completed, a delay line (DL) corresponding to the second central position is assigned to a DQS register, and a DL value of each DQ is assigned to a corresponding DQ register. The DL value of each DQ is a value obtained by converting a length that needs to be adjusted for aligning each DQ with the edge of the DQS into a scale unit corresponding to the DQ.

A parameter used to adjust the delay line of the DQS to the second central position may be referred to as a write optimization DQS timing optimization parameter.

In the foregoing method, training data is written at a low rate, and then the read command is sent to read the training data, and read direction timing training is performed. The first central position in a read training direction is determined by using values of the left and right boundaries of margin effective widths of DQs on an NFI bus, and a delay line of a DQ signal on a controller side is automatically adjusted, so that timing margin effective widths of all the DQ signals are maximized, the delay line of the DQS signal is adjusted to the first central position, and the DQS signal edge is located at an optimal sampling point of the DQ signal. Further, the custom data is written at the normal rate, the read command is sent to read the data that is just written, and write direction timing training is performed to determine the second central position. Then the delay line of the DQ signal of the controller is automatically adjusted, so that margin effective widths of all received DQ signals are maximized, the controller adjusts the delay line of the DQS signal to the second central position, and the edge of the DQS signal received by a NAND flash receiving end is located at an optimal sampling point of the DQ signal. In conclusion, in the foregoing solution, a timing margin can be optimized by adjusting the position of the delay line of the DQS signal, to enable a timing margin effective width of a signal at a receiving end is maximum, and a setup time margin and a hold time margin are maximum, thereby meeting a specification requirement, and avoiding data loss caused by a bit error during data read/write.

The left boundary and the right boundary may be determined in one of the following three specific implementations.

Manner 1: The left boundary and the right boundary are determined based on a preset boundary range [a, b].

Manner 2: The left boundary and the right boundary are determined by adjusting a DQS position leftwards and rightwards by using ¼ of the DQS cycle as a start position.

Manner 3: The left boundary and the right boundary are determined by gradually adjusting the DQS position from the left to the right from an initial scale value.

Figure 13:
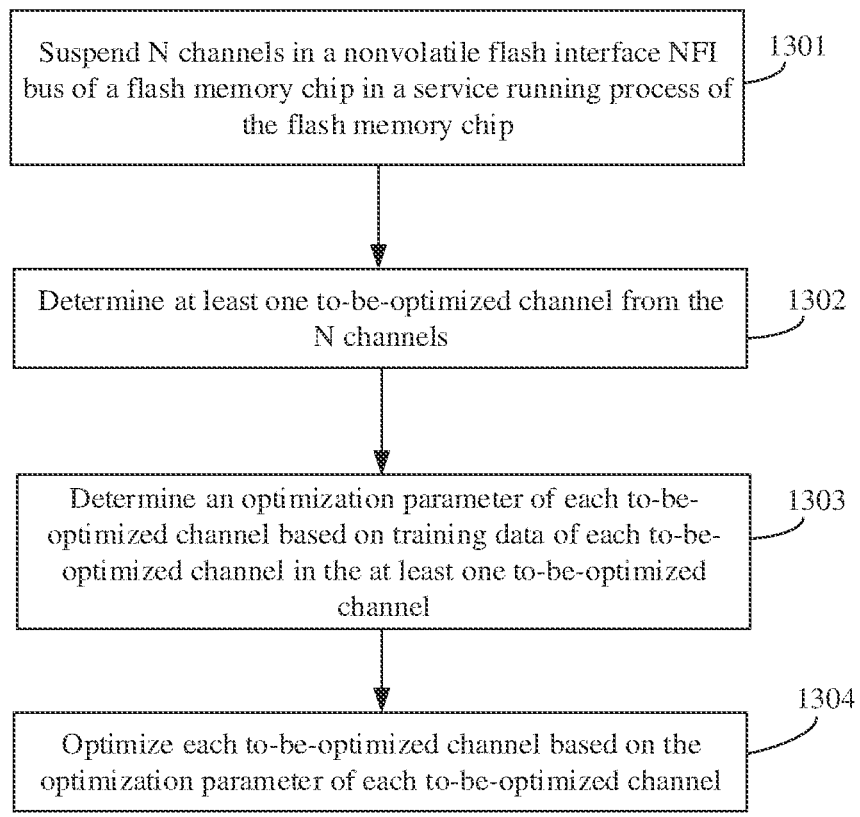
FIG. 13 is a schematic flowchart of a method for optimizing a flash memory chip according to an embodiment of the present disclosure.

FIG. 13 is a schematic flowchart of a method for optimizing a flash memory chip according to an embodiment of the present disclosure.

1301: Suspend N channels in a nonvolatile flash interface NFI bus of the flash memory chip in a service running process of the flash memory chip, where N is an integer greater than or equal to 1 and less than or equal to a total quantity of channels in the NFI bus.

1302: Determine at least one to-be-optimized channel from the N channels.

1303: Determine an optimization parameter of each to-be-optimized channel based on training data of each to-be-optimized channel in the at least one to-be-optimized channel.

1304: Optimize each to-be-optimized channel based on the optimization parameter of each to-be-optimized channel.

For specific implementations of determining a to-be-optimized channel and optimizing a parameter, refer to the foregoing embodiments.

In the foregoing technical solution, in the running process of the flash memory chip, some channels in a plurality of channels are selected for detection and optimization. In other words, another part of channels in the NFI bus are in a normal working state. Therefore, a channel parameter can be optimized without disk disconnection. Dependence on a physical environment and a working state in a margin determining standard may be reduced, and the margin determining standard may be further compressed, so that more margins are reserved for an interface link, thereby supporting a higher rate.

Figure 14:
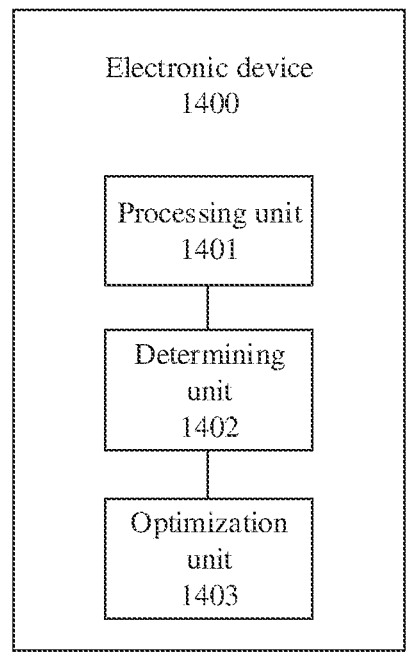
FIG. 14 is a schematic block diagram of a structure of an electronic device according to an embodiment of the present disclosure.

FIG. 14 is a schematic block diagram of a structure of an electronic device according to an embodiment of the present disclosure. The electronic device 1400 shown in FIG. 14 may be the SSD 100 shown in FIG. 1, or may be the SSD controller 110 shown in FIG. 1, or may be the flash memory controller 113 shown in FIG. 1.

A processing unit 1401 is configured to suspend N channels in a nonvolatile flash interface NFI bus of a flash memory chip in a service running process of the flash memory chip, where N is an integer greater than or equal to 1 and less than or equal to a total quantity of channels in the NFI bus.

A determining unit 1402 is configured to determine at least one to-be-optimized channel from the N channels.

The determining unit 1402 is further configured to determine an optimization parameter of each to-be-optimized channel based on training data of each to-be-optimized channel in the at least one to-be-optimized channel.

An optimization unit 1403 is configured to optimize each to-be-optimized channel based on the optimization parameter of each to-be-optimized channel.

For specific functions and beneficial effects of the processing unit 1401, the determining unit 1402, and the optimization unit 1403, refer to the foregoing embodiments.

An embodiment of the present disclosure further provides a chip system. The chip system includes a logic circuit. The logic circuit is configured to: be coupled to an input/output interface, and transmit data through the input/output interface, to perform the method shown in the foregoing embodiments.

The chip system may be the flash memory controller 113 shown in FIG. 1, or may be the SSD controller 110 shown in FIG. 1.

An embodiment of the present disclosure further provides an SSD, and the SSD includes the foregoing chip system.

An embodiment of the present disclosure further provides a computer-readable medium. The computer-readable medium stores program code, and when the computer program code is run on a computer, the computer is enabled to perform the method shown in the foregoing embodiments.

During implementation, steps in the foregoing methods can be implemented by using a hardware integrated logic circuit in a processor, or by using instructions in a form of software. The steps of the method disclosed with reference to embodiments of the present disclosure may be directly performed by a hardware processor, or may be performed by using a combination of hardware in the processor and a software module. The software module may be located in a mature storage medium in the art, such as a random access memory, a flash memory, a read-only memory, a programmable read-only memory, an electrically erasable programmable memory, or a register. The storage medium is located in the memory, and a processor reads information in the memory and completes the steps in the foregoing methods in combination with hardware of the processor.

It should be noted that, the processor in embodiments of the present disclosure may be an integrated circuit chip, and has a signal processing capability. During implementation, steps in the foregoing method embodiments can be implemented by using a hardware integrated logic circuit in the processor, or by using instructions in a form of software. A general-purpose processor may be a microprocessor, or the processor may be any conventional processor or the like. Steps of the methods disclosed with reference to embodiments of the present disclosure may be directly executed and accomplished by a hardware decoding processor, or may be executed and accomplished by a combination of hardware and software modules in a decoding processor. The software module may be located in a mature storage medium in the art, such as a random access memory, a flash memory, a read-only memory, a programmable read-only memory, an electrically erasable programmable memory, or a register. The storage medium is located in the memory, and a processor reads information in the memory and completes the steps in the foregoing methods in combination with hardware of the processor.

It may be understood that the memory in embodiments of the present disclosure may be a volatile memory or a nonvolatile memory, or may include a volatile memory and a nonvolatile memory. The nonvolatile memory may be a read-only memory (ROM), a programmable read-only memory (PROM), an erasable programmable read-only memory (EPROM), an electrically erasable programmable read-only memory (EEPROM), or a flash memory. The volatile memory may be a random access memory (RAM) used as an external cache. Through example but not limitative description, a plurality of forms of RAMs may be used, for example, a static random access memory (SRAM), a dynamic random access memory (DRAM), a synchronous dynamic random access memory (SDRAM), a double data rate synchronous dynamic random access memory (DDR SDRAM), an enhanced synchronous dynamic random access memory (ESDRAM), a synchlink dynamic random access memory (SLDRAM), and a direct rambus dynamic random access memory (DR RAM). It should be noted that the memory of the systems and methods described in this specification includes but is not limited to these and any memory of another proper type.

According to the method provided in embodiments of the present disclosure, the present disclosure further provides a computer program product. The computer program product includes computer program code, and when the computer program code is run on a computer, the computer is enabled to perform the method shown in the foregoing embodiments.

A person of ordinary skill in the art may be aware that, in combination with the examples described in embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, refer to a corresponding process in the foregoing method embodiments.

In the several embodiments provided in the present disclosure, it should be understood that the disclosed system, apparatus, and method may be implemented in other manners. For example, the described apparatus embodiment is merely an example. For example, division into the units is merely logical function division and may be other division during actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in embodiments of the present disclosure may be integrated into one processing unit, each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present disclosure essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in embodiments of the present disclosure. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A method for monitoring and retraining of a non-volatile flash interface (NFI), comprising:
    after completing write training of the NFI and establishing a data strobe signal (DQS) trigger pointdetermining whether a trigger condition for monitoring the NFI is met, wherein the DQS trigger point triggers a memory to identify an electrical level state of a write data signal (DQ) corresponding to the DQS trigger point, and the trigger condition is related to working environmental data of the NFI;
    upon determining that the trigger condition for monitoring the NFI is met, writing test data to the memory and performing a margin test on the NFI to determine whether the NFI passes the margin test; and
    upon determining that the NFI does not pass the margin test, initiating interface retraining of the NFI,
    wherein the DQS trigger point divides a cycle of the write DQ into a period before the DQS trigger point as a setup time of the write DQ and a period after the DQS trigger point as a hold time of the write DQ.

2. The method according to claim 1, further comprising:
    upon determining that the NFI passes the margin test, continuing to check whether the trigger condition for monitoring the NFI is met.

3. The method according to claim 1, wherein the working environmental data comprises data about a temperature, a working voltage, a humidity, a data transmission volume, and/or a current status of the NFI.

4. The method according to claim 3, wherein the working environmental data comprises data about a temperature, and the trigger condition for monitoring the NFI is met when a monitored temperature is greater than a temperature upper limit or less than a temperature lower limit.

5. The method according to claim 1, wherein the margin test comprises a timing margin test that includes:
    setting N levels of a reference voltage, wherein N is a positive integer greater than or equal to 2;
    for each of the N levels of the reference voltage, performing a read direction timing margin test on the test data written into the memory and recording an effective width of a read direction timing margin as a read direction timing effective width at the respective level, and performing a write direction timing margin test on the test data written into the memory and recording an effective width of a write direction timing margin as a write direction timing effective width at the respective level; and
    determining whether the timing margin test is passed based on the read direction timing effective widths at the N levels and the write direction timing effective widths at the N levels.

6. The method according to claim 5, wherein the determining whether the timing margin test is passed based on the read direction timing effective widths at the N levels and the write direction timing effective widths at the N levels comprises:

for each of the N levels, determining whether the read direction timing effective width at the respective level is within a first corresponding threshold range, and upon determining that the read direction timing effective width at the respective level is within the first corresponding threshold range, determining that the read direction timing effective width at the respective level passes the timing margin test in a read direction;

for each of the N levels, determining whether the write direction timing effective width at the respective level is within a second corresponding threshold range, and upon determining that the write direction timing effective width at the respective level is within the second corresponding threshold range, determining that the write direction timing effective width at the respective level passes the timing margin test in a writing direction; and determining whether the timing margin test is passed based on one or more levels in the N levels that pass the timing margin test in the read direction and/or the write direction.

7. The method according to claim 1, wherein the margin test comprises a voltage margin test that includes:

setting N DQS delay levels, wherein N is a positive integer greater than or equal to 2;

for each of the N DQS delay levels, performing a read direction voltage margin test on the test data written into the memory and recording a read direction voltage margin at the level, and performing a write direction voltage margin test on the test data written into the memory and recording a write direction voltage margin at the level; and determining whether the voltage margin test is passed based on the read direction voltage margins at the N DQS delay levels and the write direction voltage margins at the N DQS delay levels.

8. The method according to claim 7, wherein the determining whether the voltage margin test is passed based on the read direction voltage margins and the write direction voltage margins at the N DQS delay levels comprises:

for each level of the N DQS delay levels, determining whether the read direction voltage margin at the level is within a first corresponding threshold range, and upon determining that the read direction voltage margin at the level is within the first corresponding threshold range, determining that the read direction voltage margin at the level passes the voltage margin test in a read direction;

for each level of the N DQS delay levels, determining whether the write direction voltage margin at the level is within a second corresponding threshold range, and upon determining that the write direction voltage margin at the level is within the second corresponding threshold range, determining that the write direction voltage margin at the level passes the voltage margin test in a writing direction; and determining whether the voltage margin test is passed based on one or more levels in the N DQS delay levels that pass the voltage margin test in the read direction and/or the write direction.

9. The method according to claim 1, wherein the interface retraining of the NFI comprises adjusting the DQS trigger point to reduce a difference between a timing margin of the setup time of the write data signal (DQ) and a timing margin of the hold time of the write DQ.

10. The method according to claim 9, wherein when an electrical level of the write DQ is lower than a reference voltage, the write DQ is a low electrical level, and when the electrical level of the write DQ is higher than the reference voltage, the write DQ is a high electrical level;

the electrical level of the write DQ reaches the reference voltage at a minimum time point and a maximum time point;

a time interval between the minimum time point and a start time point of the cycle of the write DQ is a minimum setup time applicable to the memory, and a time interval between the maximum time point and an end time point of the cycle of the write DQ is a minimum hold time applicable to the memory; and in the cycle of the write DQ, a difference between the setup time of the write DQS and the minimum setup time is the timing margin of the setup time of the write DQ, and a difference between the hold time of the write DQS and the minimum hold time is the timing margin of the hold time of the write DQ.

11. The method according to claim 10, wherein interface retraining of the NFI comprises:

adjusting the DQS trigger point to a middle position between the minimum time point and the maximum time point.

12. The method according to claim 1, wherein interface retraining of the NFI comprises:

reading data signals of the test data form the memory;

sampling the data signals to obtain a plurality of timing margin effective widths of the data signals;

determining a left boundary and a right boundary based on the timing margin effective widths, wherein the left boundary is a largest value in a plurality of minimum values of the plurality of timing margin effective widths, and wherein the right boundary is a smallest value in a plurality of maximum values of the plurality of timing margin effective widths when the data signals are all aligned with the left boundary;

calculating a first central position based on the left boundary and the right boundary; and adjusting the DQS trigger point to the first central position.

13. The method according to claim 12, wherein the first central position is an average value of the left boundary and the right boundary.

14. The method according to claim 12, wherein the interface retraining of the NFI further comprises:

performing write direction margin timing training based on the left boundary and the right boundary to obtain a second central position; and adjusting the DQS trigger point to the second central position.

15. The method according to claim 1, wherein interface retraining of the NFI comprises:

obtaining K read margins and K write margins in a one-to-one correspondence with K levels, wherein K is a positive integer greater than 1;

determining an average value of the K read margins as a read optimization voltage;

determining an average value of the K write margins as a write optimization voltage; and performing training of the NFI based on the read optimization voltage and the write optimization voltage.

16. A solid-state disk (SSD) controller configured to read and execute instructions and/or program code in a flash memory coupled to the SSD controller via a nonvolatile flash interface (NFI), to perform operations comprising:

after completing write training of the NFI and establishing a data strobe signal (DQS) trigger point, determining whether a trigger condition for monitoring the NFI is met, wherein the DQS trigger point triggers the flash memory to identify an electrical level state of a write data signal (DQ) corresponding to the DQS trigger point, and the trigger condition is related to working environmental data of the NFI;

upon determining that the trigger condition for monitoring the NFI is met, writing test data to the flash memory and performing a margin test on the NFI to determine whether the NFI passes the margin test; and upon determining that the NFI does not pass the margin test, initiating interface retraining of the NFI, wherein the DQS trigger point divides a cycle of the write DQ into a period before the DQS trigger point as a setup time of the write DQ and a period after the DQS trigger point as a hold time of the write DQ.

17. The SSD controller according to claim 16, wherein the operations further comprise:

upon determining that the NFI passes the margin test, continuing to check whether the trigger condition for monitoring the NFI is met.

18. A solid-state disk (SSD), comprising an SSD controller coupled to a flash memory through a nonvolatile flash interface (NFI), wherein the SSD controller is configured to perform operations comprising:

after completing write training of the NFI and establishing a data strobe signal (DQS) trigger point, determining whether a trigger condition for monitoring the NFI is met, wherein the DQS trigger point triggers the flash memory to identify an electrical level state of a write data signal (DQ) corresponding to the DQS trigger point, and the trigger condition is related to working environmental data of the NFI;

upon determining that the trigger condition for monitoring the NFI is met, writing test data to the flash memory and performing a margin test on the NFI to determine whether the NFI passes the margin test; and upon determining that the NFI does not pass the margin test, initiating interface retraining of the NFI, wherein the DQS trigger point divides a cycle of the write DQ into a period before the DQS trigger point as a setup time of the write DQ and a period after the DQS trigger point as a hold time of the write DQ.

19. The SSD according to claim 18, wherein the operations further comprise:

upon determining that the NFI passes the margin test, continuing to check whether the trigger condition for monitoring the NFI is met.

20. An electronic device comprising a solid-state disk (SSD) including an SSD controller coupled to a flash memory through a nonvolatile flash interface (NFI), wherein the SSD controller is configured to perform operations comprising:

after completing write training of the NFI and establishing a data strobe signal (DQS) trigger point, determining whether a trigger condition for monitoring the NFI is met, wherein the DQS trigger point triggers the flash memory to identify an electrical level state of a write data signal (DQ) corresponding to the DQS trigger point, and the trigger condition is related to working environmental data of the NFI;

upon determining that the trigger condition for monitoring the NFI is met, writing test data to the flash memory and performing a margin test on the NFI to determine whether the NFI passes the margin test; and upon determining that the NFI does not pass the margin test, initiating interface retraining of the NFI, wherein the DQS trigger point divides a cycle of the write DQ into a period before the DQS trigger point as a setup time of the write DQ and a period after the DQS trigger point as a hold time of the write DQ.

21. The electronic device according to claim 20, wherein the operations further comprise:

upon determining that the NFI passes the margin test, continuing to check whether the trigger condition for monitoring the NFI is met.

* * * * *

UNITED STATES PATENT AND TRADEMARK OFFICE
CERTIFICATE OF CORRECTION

PATENT NO. : 12,387,809 B2
APPLICATION NO. : 18/455031
DATED : August 12, 2025
INVENTOR(S) : Jun Yu Page 1 of 1

It is certified that error appears in the above-identified patent and that said Letters Patent is hereby corrected as shown below:

In the Specification

Column 6, Line 49, change "from to" to --from t0--;

Column 12, Line 37, change "bus is ns" to --bus is 0.625 ns--; and

In the Claims

Column 28, Claim 1, Line 15, change "pointdetermining" to --point, determining--.

Signed and Sealed this
Thirtieth Day of September, 2025

John A. Squires
*Director of the United States Patent and Trademark Office*